(12) United States Patent
Gerasimchuk et al.

(10) Patent No.: US 9,982,188 B2
(45) Date of Patent: May 29, 2018

(54) NEAR-INFRARED EMITTERS

(71) Applicant: MISSOURI STATE UNIVERSITY, Springfield, MO (US)

(72) Inventors: Nikolay Gerasimchuk, Springfield, MO (US); Mikhail Berezin, St. Louis, MO (US)

(73) Assignee: Missouri State University, Springfield, MO (US)

( * ) Notice: Subject to any disclaimer, the term of this patent is extended or adjusted under 35 U.S.C. 154(b) by 0 days. days.

(21) Appl. No.: 15/001,023

(22) Filed: Jan. 19, 2016

(65) Prior Publication Data

US 2016/0208162 A1  Jul. 21, 2016

Related U.S. Application Data

(60) Provisional application No. 62/105,434, filed on Jan. 20, 2015.

(51) Int. Cl.
| | |
|---|---|
| *C07F 15/00* | (2006.01) |
| *C09K 11/06* | (2006.01) |
| *H01L 51/00* | (2006.01) |
| H01L 51/50 | (2006.01) |
| H01L 51/42 | (2006.01) |

(52) U.S. Cl.
CPC .......... *C09K 11/06* (2013.01); *H01L 51/0034* (2013.01); *H01L 51/0087* (2013.01); *C09K 2211/1007* (2013.01); *C09K 2211/1029* (2013.01); *C09K 2211/1033* (2013.01); *C09K 2211/185* (2013.01); *H01L 51/42* (2013.01); *H01L 51/5012* (2013.01)

(58) Field of Classification Search
USPC ......................................................... 556/167
See application file for complete search history.

(56) References Cited

PUBLICATIONS

Zhang et al., "Syntheses, Structures, Near-Infrared and Visible Luminescence, and Magnetic Properties of Lanthanide-Organic Frameworks with an Imidazole-Containing Flexible Ligand", Inorg. Chem. 2006, 45, 2896-2902.*
Ratcliff et al., Inorganica Chimica Acta (2012), 385, 1-11.*
Eddings et al., Inorg Chem (2004), 43(13), 3894-3909.*
Nguyen et al., Phys. Chem. Chem. Phys., 2007, 9, 1515-1532.*
Eddings et al., Inorg Chem (2004), 43, 3894-3909.*

* cited by examiner

*Primary Examiner* — Sudhakar Katakam
*Assistant Examiner* — Kofi Adzamli
(74) *Attorney, Agent, or Firm* — Lathrop Gage L.L.P.

(57) ABSTRACT

A system and method for producing a near-infrared sensitive luminescent materials beyond 1000 nm is disclosed. The method includes reacting $K_2[PtCl_4]$ and cyanoxime ligands in an aqueous solution to achieve dark-green one-dimensional coordination-polymeric materials having a molecular formula of $PtL_2$, wherein L are the cyanoxime ligands having a molecular formula of NC—C(=NOH)—R with R being an electron withdrawing group such as: N'N-diethylacetamide, N-piperidine, N-morpholyl, 2-pyridine, benzoyl, or N-pyrrolidine.

15 Claims, 35 Drawing Sheets

NEAR-INFRARED EMITTERS

CROSS-REFERENCE TO RELATED APPLICATION

This application claims priority to U.S. Provisional Application Ser. No. 62/105,434, filed on Jan. 20, 2015, which is incorporated by reference herein in its entirety.

BACKGROUND

Near-infrared (NIR) technology has many applications including in the industrial, scientific, military, and medical fields. However, the number of near-infrared (NIR) sensitive luminescent materials is limited. As a result, there are very few emitters that perform between 1000 and 1200 nm. Emitters operating in this range may have many benefits across a wide array of applications.

SUMMARY

The following presents a simplified summary of the invention in order to provide a basic understanding of some aspects of the invention. This summary is not an extensive overview of the invention. It is not intended to identify critical elements of the invention or to delineate the scope of the invention. Its sole purpose is to present some concepts of the invention in a simplified form as a prelude to the more detailed description that is presented below.

In one embodiment of the invention, a process for the production of a luminescent polymeric material includes reacting $K_2[PtCl_4]$ and a cyanoxime ligand in an aqueous solution to achieve a material having a molecular formula of $PtL_2$ wherein L is the cyanoxime ligand having a molecular formula of 2-cyano-2-oximino-N,N'-diethylacetamide. In one aspect of the invention, the material luminesces in the near-infrared region of spectrum. In another aspect of the invention, $PtL_2$ complex self-assembles in solutions into a luminescent 1D polymeric poker chip structure. In still another aspect of the invention, the $PtL_2$ compound is stable at room temperature.

In still yet another aspect of the invention, the $PtL_2$ complex is incorporated for use in at least one of a light emitting device, an optical sensor, and as a theranostic agent. In a further aspect of the invention, the $PtL_2$ complex has three polymorphic forms comprising monomeric $PtL_2$, dimeric $[PtL_2]_2$, and $[PtL_2]_n$, wherein dimeric $[PtL_2]_2$ is formed by treating monomeric $PtL_2$ with a non-disruptive solvent and $[PtL_2]_n$ is formed by disaggregation of dimeric $[PtL_2]_2$ over a predetermined time; and wherein $[PtL_2]_n$ is a dark green precipitate. In still a further aspect of the invention, approximately 3-10% by weight $[PtL_2]_n$ is embedded in an inert solid matrix to form a pellet, wherein the inert solid matrix is KBr. In yet a further aspect of the invention, $[PtL_2]_n$ strongly absorbs in 400-900 nm range and luminesces at 1000-1200 nm.

In another embodiment of the invention, a process for the production of a near-infrared sensitive luminescent polymeric material includes reacting $K_2[PtCl_4]$ with a cyanoxime ligand to achieve a formula having the molecular formula $PtL_2$. The cyanoxime ligand is selected from the list consisting of:

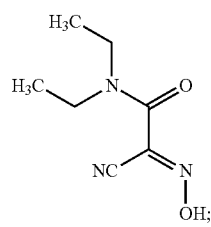

HDECO
(A)

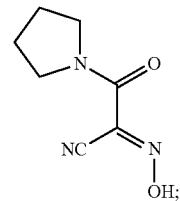

HPyrCO
(B)

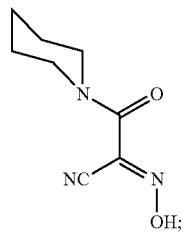

HPiPCO
(C)

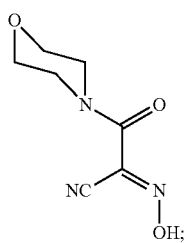

HMCO
(D)

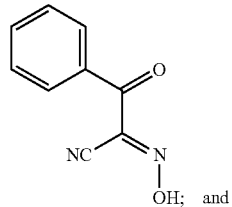

HBCO; and
(E)

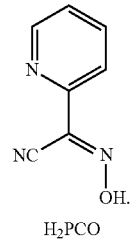

H2PCO
(F)

In one aspect of the invention, each of the resulting $PtL_2$ complexes luminesces in the NIR spectrum between 950 nm and 1500 nm. In another aspect of the invention, the PtL$_2$ complex self-assembles in solutions into a luminescent 1D polymeric poker chip structure. In still another aspect of the invention, approximately 3-10% by weight of the PtL$_2$ complex is embedded with an inert solid matrix to form a pellet. In still yet another aspect of the invention, the inert solid matrix is KBr.

In a further aspect of the invention, the signal intensity of the emission of the KBr pellet with PtL$_2$ decreases with decreasing temperature. In still a further aspect of the invention, the emission wavelength of the KBr pellet with PtL$_2$ is higher than the emission wavelength of pure PtL$_2$ powder.

In still yet another embodiment of the invention, a class of compounds is disclosed that luminesces in the NIR spectrum having a molecular formula PtL$_2$, wherein L is a cyanoxime ligand having the molecular formula NC—C(=NOH)—R, and wherein R is an electron withdrawing group. In one aspect of the invention, the cyanoxime ligand is one of:

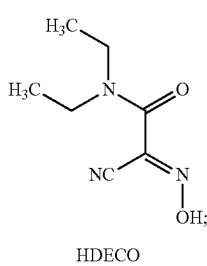
(A)
HDECO

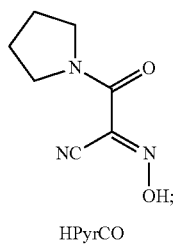
(B)
HPyrCO

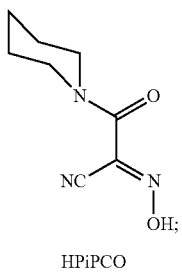
(C)
HPiPCO

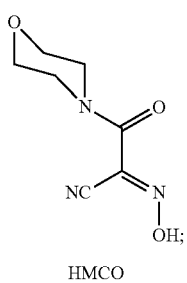
(D)
HMCO

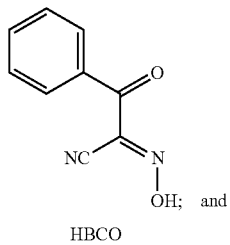
(E)
HBCO; and

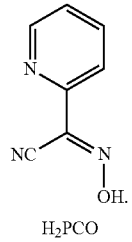
(F)
H$_2$PCO

In an aspect of the invention, the cyanoxime ligand is HDECO, and the compound luminesces at NIR region of the electromagnetic spectrum between approximately 1020 and 1070 nm. In another aspect of the invention, the PtL$_2$ compound is incorporated for use in one of a light emitting device, an optical sensor, and as a theranostic agent for anticancer diagnosis and treatment. In still another aspect of the invention, the PtL$_2$ compound self-assembles in solutions into a luminescent 1D polymeric poker chip structure.

BRIEF DESCRIPTION OF THE DRAWINGS

FIG. 25 (B) is a perspective view of 1.5 cells along c showing the tilt angle between two Pt—Pt distances in 4.

FIG. 39 (B) is a photograph showing a KBr pellet containing ~5% of the complex adhered to cold finger.

DETAILED DESCRIPTION

Figure 1:
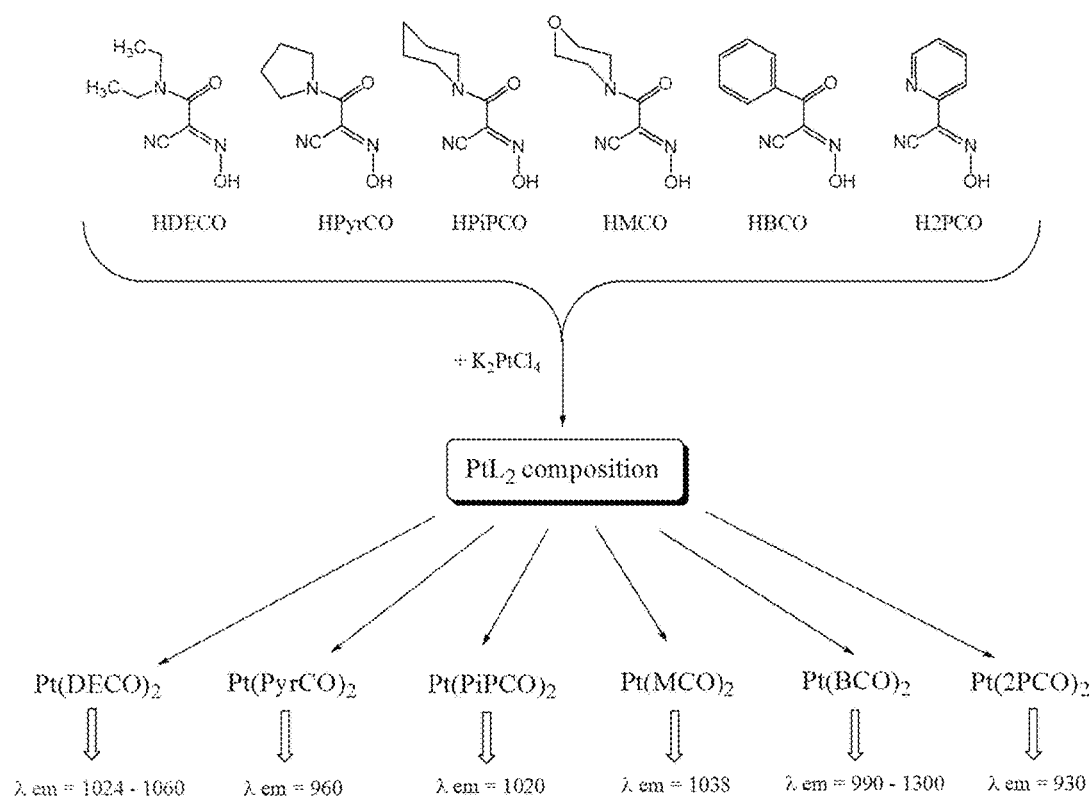
FIG. 1 shows structures of cyanoxime ligands that form Pt-based solids which emit in the NIR region of the electromagnetic spectrum. Wavelengths of their emission are shown below in their abbreviated formulae.

In the last decade, near-infrared (NIR) technology opened up a variety of novel directions in industrial, scientific, military and medical applications including optical devices, sensors, contrast agents, and imaging techniques. As a result of the development of new technology, a diverse set of photoluminescent compounds emitting in NIR have emerged, from small molecules to nanoparticles and aggregates. However, the great majority of these materials emits up to 800-850 nm, while the number of NIR emitters with emission above 1000 nm is still limited.

Fundamental constraints, such as the energy gap law (stating that radiationless transitions at longer wavelengths increase due to vibrational overlaps between the ground and excited states causing a decrease in luminescence efficiency) significantly restrict the number of luminescent materials beyond 1000 nm. Reported compounds include some lanthanide complexes, cyanine dyes (such as IR-1061 and IR-1048 shown below), certain types of quantum dots, such as those based on halcogenides of Zn and Cd, nanoparticles of variable sizes based on precious metals (e.g., Au), and single wall carbon nanotubes.

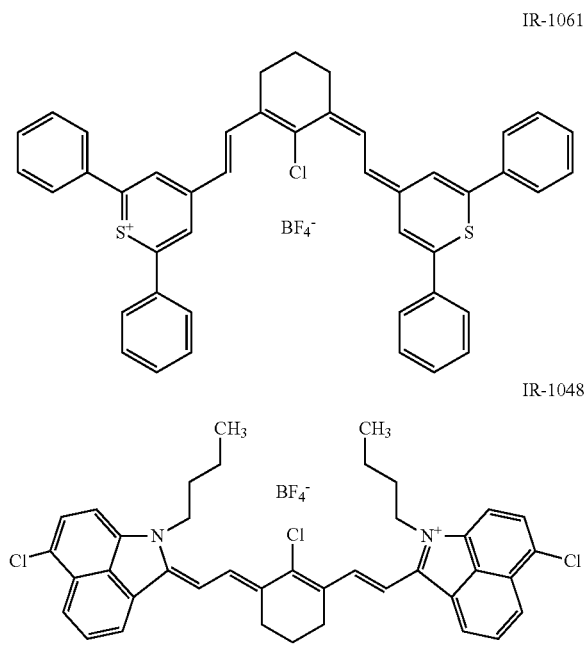

IR-1061

IR-1048

Recently, supramolecular assemblies with non-covalent metal-metal (metallophilic) interactions emerged as an attractive way to synthesize NIR luminescent materials that feature palladium nanowires or Pt-self-assembled aggregates. In these structures, significant metal-metal interaction extended over multiple metal centers lowers the gap between the ground and excited states, resulting in longer emission wavelengths. These materials are especially promising because of their tunable optical properties that can be adjusted by the type of the ligand and controlled synthesis regulating the number of assembled complexes (polymorphs). Recently, some platinum (Pt) complexes with their known propensity to metal-metal interactions and polymorphism, have attracted attention due to their emissive properties up to 800 nm.

One key factor to the development of supramolecular emitters with the desired optical properties may be to control the aggregation process. Described herein is a new class of 1D Pt-based luminescent complexes with strong emission beyond 1000 nm that challenges the energy gap law. The choice of a suitable ligand system may be critical for successful preparation of such 1D complexes. Among ambidentate ligands, the oximes discussed herein may be especially useful because of their strong affinity for Ni-triade metals that favor square-planar geometry.

Previous studies suggest selecting cyanoximes as ligands for binding Pt(II) centers. Cyanoximes are particularly flexible mixed-donor ligands that allow modular design and are the platform of choice for developing metal complexes with controlled self-assembly in solutions and solid state.

It may be understood that in the design of long wavelength emitters Pt(II), environment facilitates metallophilic interactions leading to the red shift of the emission and fulfill necessary geometric requirements for the formation of mixed valence species. These interactions are kinetically controlled and lead to 1D aggregation along the M---M vector resulting in a red-to-near infrared-luminescent 1D polymer. Recently, Pd-based mixed valence 1D "metallic wire" complexes have shown a very intense NIR emission.

It may be further understood that the anion's bulkiness from substituents would control the distance between the metal centers. Therefore, among known cyanoxime ligands those with amide groups provide greater variety of electronic, steric properties and solubility. Thus, novel bivalent Pd, Pt complexes were synthesized using a well soluble in organic solvents cyanoxime ligand, 2-cyano-2-oximino-N,N'-diethylaminoacetamide H(DECO) (1). As is discussed in greater detail below, the Pt-complex self-assembles in solutions into a luminescent 1D polymeric "poker chips" structure.

To address the need for additional luminescent material, a new class of luminescent polymeric metal complexes was developed having unique optical properties in the NIR optical window. One object of the present invention is to characterize the synthesis and the emission properties of a new photoluminescent (PL) Pt member of cyanoximes family. It is another object of the invention to synthesize and characterize related bivalent Pd and Pt monomeric complexes having an M(DECO)$_2$ composition. The development of the new luminescent polymeric metal complexes is described in detail herein in the following experimental section.

A system and method for producing a near-infrared sensitive luminescent materials beyond 1000 nm is disclosed. The method includes reacting K$_2$[PtCl$_4$] and cyanoxime ligands in an aqueous solution to achieve dark-green one-dimensional coordination-polymeric materials having a molecular formula of PtL$_2$, wherein L are the cyanoxime ligands having a molecular formula of NC—C(=NOH)—R, with R being an electron withdrawing group such as N'N-diethylacetamide, N-piperidine, N-morpholyl, 2-pyridine, benzoyl, or N-pyrrolidine, for example. Exemplary compounds are shown in FIG. 1.

Since all six compounds shown in FIG. 1 react with the Pt-source in the same way, the following description of the synthesis of compounds, their structures and spectra is directed to the compound $Pt(DECO)_2$, wherein DECO is the cyanoxime ligand having a molecular formula of 2-cyano-2-oximino-N,N'-diethylacetamide.

EXPERIMENTAL SECTION

Provided herein are exemplary compositions displaying unique optical properties in the NIR optical window. The complexes demonstrate unique optical behavior as exemplified by platinum (Pt) metal with cyanoxime ligands indicating broad absorbance in the 700-900 nm range and luminescence at 1000-1200 nm.

General Considerations

All necessary chemicals, such as cyanoacetic acid ester, $K_2CO_3$, $K_2[PdCl_4]$, $K_2[PtCl_4]$ and organic solvents were obtained from commercial sources and used without further purification. The elemental composition of the starting cyanoxime and its Pd,Pt-complexes on C,H,N content was determined using the combustion method at Atlantic Microlab (Norcross, Ga.). Melting points were measured on a Digimelt apparatus without correction.

Figure 2:
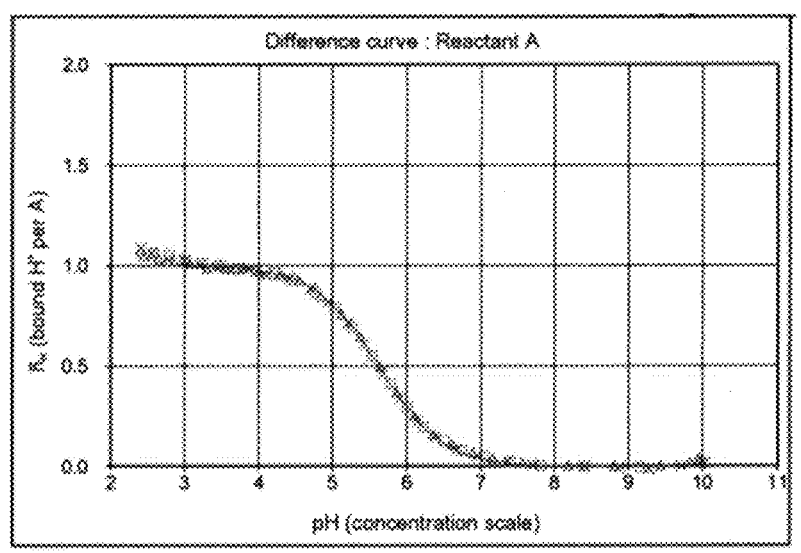
FIGS. 2-4 show experimental details of potentiometric determination of pK$_a$ for studied ligand HDECO, 1, NC—C(N=O—H)—C(O)N(C$_2$H$_5$)$_2$.
Figure 3:
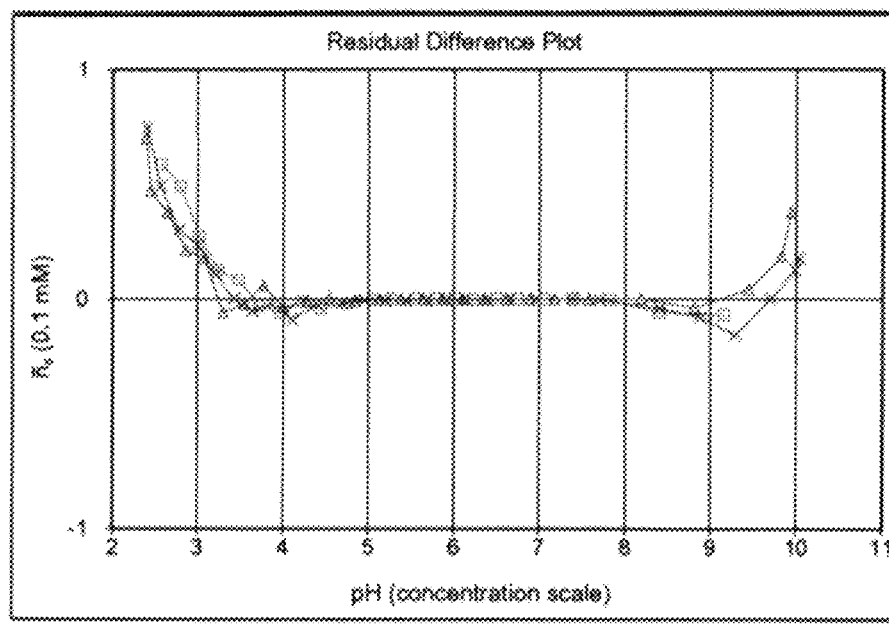
Figure 4:
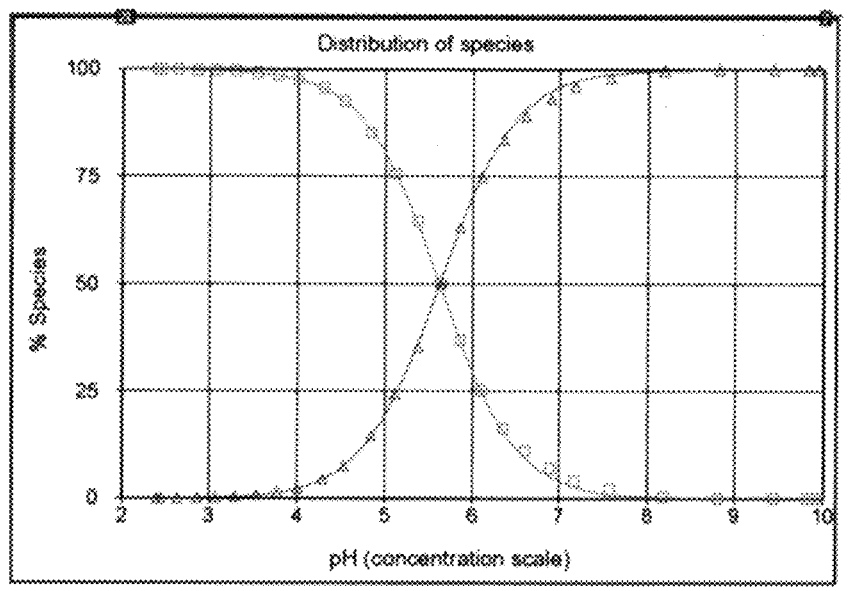

Solution Studies: Details of pKa of the New Cyanoxime Determination and Conductivity Measurements for its Complexes Ionization constants for the new cyanoxime compound 1 [H(DECO)] were determined using a Sirius Analytical Instruments automated titration station (Sussex, UK) equipped with a temperature-controlled bath. The titration was performed three times at 23° C. in an isopropyl alcohol (ISA) water mixture as described below. The weighed amount of compound 1 (3.08 mg) was placed into a titration vial. Sixteen milliliters of ISA water was delivered automatically to the vial. The pH of the solution was adjusted to 10 by adding 0.5 M KOH automatically. The titration with 0.5M HCl was performed automatically until a pH value of 2.5 was reached. To perform the second and third titrations, an additional volume of ISA and water (1 mL and 1 mL) was delivered automatically to the titration vial, respectively. The datasets for the three titrations were combined in the RefinementPro program to create a Multiset for pKa calculation. Also, these datasets were combined and extrapolated to a zero ISA concentration. The titration curve, residual difference plot and distribution of species are shown in FIGS. 2-4.

The aqueous pKa was calculated with a Yasuda-Shedlovsky extrapolation in the RefinementPro software. The pKa values for 1 and two other closely related amide-cyanoximes are summarized in Table 1, below.

TABLE 1

Some thermodynamic and geometrical parameters of a series of amide-cyanoximes and their complexes

| | | $^1$H NMR data | | | | X-ray data of bonds length, Å | | | |
| --- | --- | --- | --- | --- | --- | --- | --- | --- | --- |
| | pH titration | | | | | amide group | nitroza/oxime group | | |
| Compound | $pK_a$ | $T_o$, °C. | $k_o$, $s^{-1}$ | $\Delta G^{\neq}$, kJ/M | | N3—C3 | N1—O1 | O1—H | Ref |
| H(ACO) | 5.034 ± 0.002 | 50 | 72 | 67.7 ± 0.06 | | 1.331 | 1.355 | 1.01 | [1, 2] |
| H(DCO) | 5.52 ± 0.03 | 80 | 126 | 72.6 ± 0.07 | | 1.328 | 1.360 | 0.96 | [1, 3] |
| H(DECO), 1 | 5.622 ± 0.005 | 60 | 60 | 70.5 ± 0.09 | | 1.321 | 1.372 | 0.92 | this work |

TABLE 1-continued

Some thermodynamic and geometrical parameters of a series of amide-cyanoximes and their complexes

| Compound | 1H NMR data | | | | X-ray data of bonds length, Å | | | Ref |
|---|---|---|---|---|---|---|---|---|
| | pH titration | | | | amide group | nitroza/oxime group | | |
| | p$K_a$ | $T_o$, °C. | $k_o$, s$^{-1}$ | $\Delta G^\neq$, kJ/M | N3—C3 | N1—O1 | O1—H | |
| Pd(DECO)$_2$, 3 yellow, monomeric | — | 55 | 159 | 66.8 ± 1 | 1.323, 1.326$^a$ | 1.247, 1.247$^a$ | — | this work |
| Pt(DECO)$_2$, 6 yellow, monomeric | — | 100 | 146 | 76.6 ± 1 | 1.321, 1.325$^a$ | 1.249, 1.249$^a$ | — | this work |

$^a$—two slightly different ligands formed two chelate rings in the structures

Electrical conductivity measurements were carried out at 22° C. in dimethyl sulfoxide (DMSO) solutions at 1 mM concentrations of synthesized Pd, Pt-complexes, using the Vernier LabQuest Digital Conductivity meter. An electrode was calibrated with 1 mM DMSO solutions of N(C$_4$H$_9$)$_4$$^+$ Br$^-$, P(C$_6$H$_5$)$_4$$^+$Br$^-$, and K$_2$PtCl$_4$. The values of the conductivities of Pd, Pt cyanoximates are listed below in Table 2.

TABLE 2

Electrical Conductivity of Complexes

| Compound: | Conductivity, µS/cm | Electrolyte type |
|---|---|---|
| Pure DMSO | 2.5 | no conductance |
| N(C$_4$H$_9$)$_4$Br | 26.5 | 1:1 |
| P(C$_6$H$_5$)Br | 26.1 | 1:1 |
| K$_2$PtCl$_4$ | 64.2 | 2:1 |
| Pd(DECO)$_2$, 3 | 3.4 | no conductance |
| Pt(DECO)$_2$, 6 | 64.2 | no conductance |

Instrumentation and Methods of Spectroscopic Studies

NMR Spectroscopy.

The synthesized organic compound 1 and its substituted acetonitrile precursor were characterized by 1H, 13C NMR spectroscopy (solutions in dmso-d6; TMS was an internal standard; Varian INova 400 MHz spectrometer). Variable temperature experiments for compounds 1, 3 and 6 (see Table 1) were conducted in the 20-95° C. range.

Infrared Spectroscopy.

Infrared spectra were recorded in KBr pellets for compounds 1, 3-6 in the range of 400-4000 cm$^{-1}$, using the FT-IR Bruker Vertex S70 spectrophotometer with 64 repetitions at 23° C. and 4 cm$^{-1}$ resolution.

Absorption Spectroscopy.

The UV-visible spectra of the cyanoxime 1 and its anion 2 (as NHEt$_3$$^+$ salt) were recorded at room temperature (293 K) using an HP 8354 spectrophotometer in the range of 200-1100 nm, in 1 mm and 10 mm quartz cuvettes (Starna, Inc.). The solid state UV-visible spectra of compounds of interest (Magnus Green Salt (MGS), K$_2$[Pt(CN)$_4$] (KCP), and mixed valence partially oxidized with bromine K$_2$[Pt(CN)$_4$]$_n$.0.3 Br.H$_2$O, (later POCP), as well as synthesized complexes 3-5, and Pd(DECO)$_2$ complex 6 (see Scheme 1, following) were recorded as absorbance spectra from their fine suspensions in mineral oil using the above diode array spectrophotometer. Absorption spectra of the tablets were recorded using a custom setup based on an integrating sphere fiberoptically connected to a silicon-based diode array CCD camera Synapse (Horiba). Halogen light (HL-2000, Ocean Optics) was used as a light source. Integration time 0.05 s, slit 2 nm. All spectra were collected 10 times and averaged. The spectra were collected for light intensity. Absorption spectra were referenced to the spectrum of pure, neat KBr tablet.

Emission Spectroscopy.

The photoluminescence ("PL") of solid metal complexes was investigated using the following experimental setup based on the Horiba model spectrofluorimeter using the CCD liquid nitrogen cooled InGaAs diode array camera Symphony (Horiba) sensitive in the 600-1600 nm range, and a 3 s integration time with 20 times signal accumulation in a summation mode. In both types of experiments, emission and excitation slits were kept constant at a width of 10 nm. The excitation was conducted with a Xe-lamp using a double grating (2×1200 gm/mm @ 500 mm) monochromator. A long band pass 830 nm Schott RG 830 filter was placed in front of the spectrograph iHR-820 with grating 100 gm/mm @ 800 mm. The system was calibrated with the laser (Nd doped) glass before every set of measurements. A custom built anodized aluminum vacuum pumped cryostat filled with liquid N$_2$/oil was used for variable temperature experiments in the −195/+70° C. range where a J-Kem Scientific digital thermometer with a T-type thermocouple was used to monitor temperature. 3D excitation-emission scans of the tablets (KBr matrix with 5% of metal complexes) were recorded with the simultaneous measurement of the light intensity (R) and correcting the emission by light intensity. Absolute fluorescence quantum yield of the tablet was measured using a large 150 mm (6 inch) integrating sphere using fiber optic bundle with high transmission in NIR. The tablet was placed at the bottom-loading circular shallow drawer in the sphere. All tablets were pressed as 13 mm disks from thoroughly homogenized mixture of the IR-spectroscopy grade KBr and studied complexes 3-6 using Carver hydraulic press at 23° C. and pressure of 9 metric tons (6000 psi).

All glassware cuvettes and hardware parts that were in contact with either KBr pellets, or powders of studied metal complexes 3-6 were washed using warm to ~65° C. dimethyl fomamide (DMF) followed by DI (deionized) water to avoid contamination and avoid exclude misinterpretation of results of photo-luminescence measurements related to contamination. All synthesized complexes are well soluble in DMF.

EPR Spectroscopy.

Spectra were recorded on Bruker EMXplus X-band EPR spectrometer with dual mode cavity and Oxford cryostat system at +20 and −193° C. using filed sweep from 200 to 4000 G. Field was calibrated using the DFPG, while sensitivity of instrument was checked using a solid standard containing 1% of $Cr_3^+$ in $Al_2(SO_4)_3$. Spectra were recorded as a sum of five repetitions with time constant for each set at 160 ms.

X-Ray Crystallography.

Crystal structures were determined for the cyanoxime H(DECO) [compound 1], and compounds 3, 4 and 6, suitable single crystals of which were grown by ether vapors diffusion method in $CH_3CN$ solutions.

Figure 5:
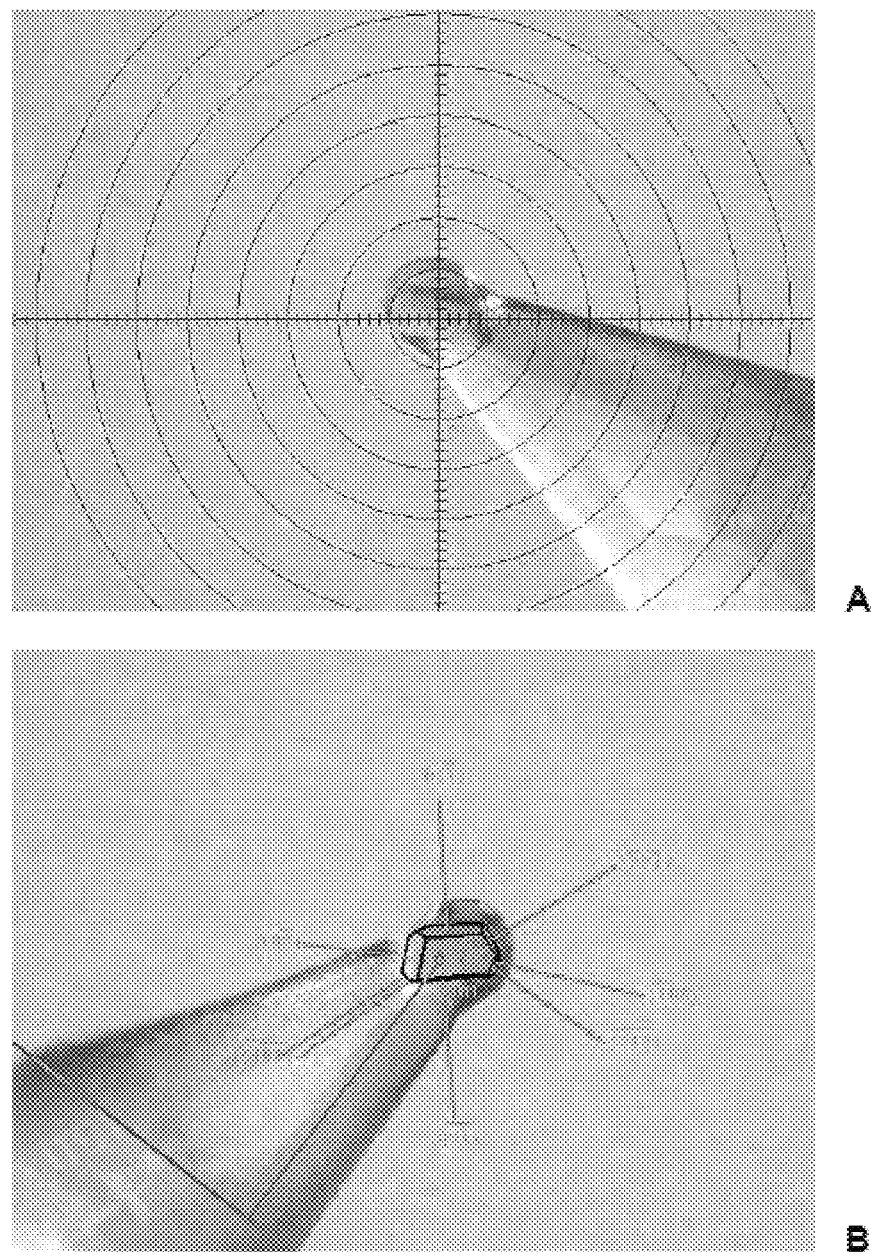
FIG. 5 (A)-(B) shows crystal data for yellow monomeric Pt(DECO)$_2$ (complex 3).
Figure 6:
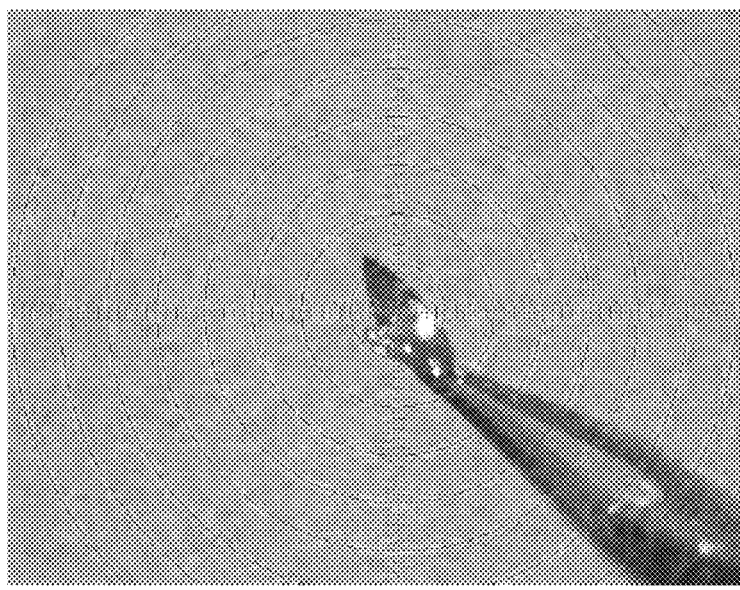
FIG. 6 (A)-(B) shows crystal data for the red dimer Pt(DECO)$_2$ (complex 4).
Figure 6:
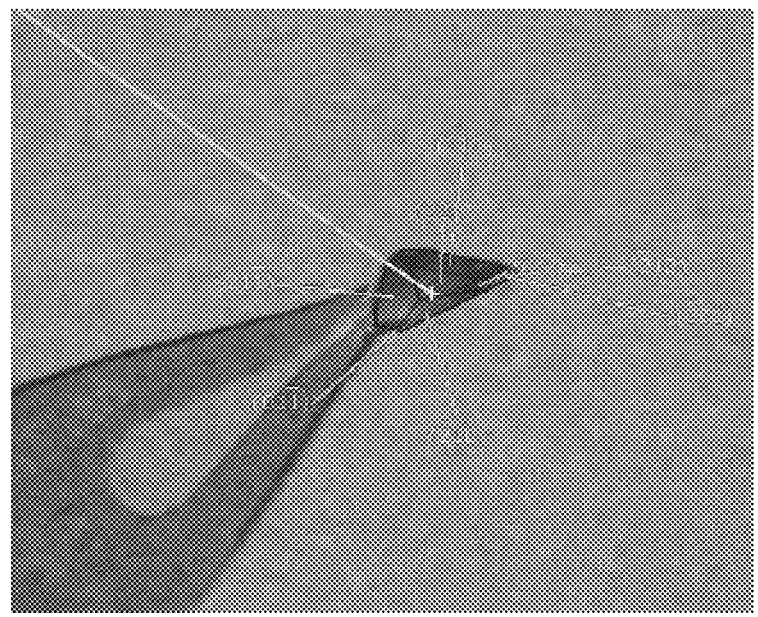
Figure 7:
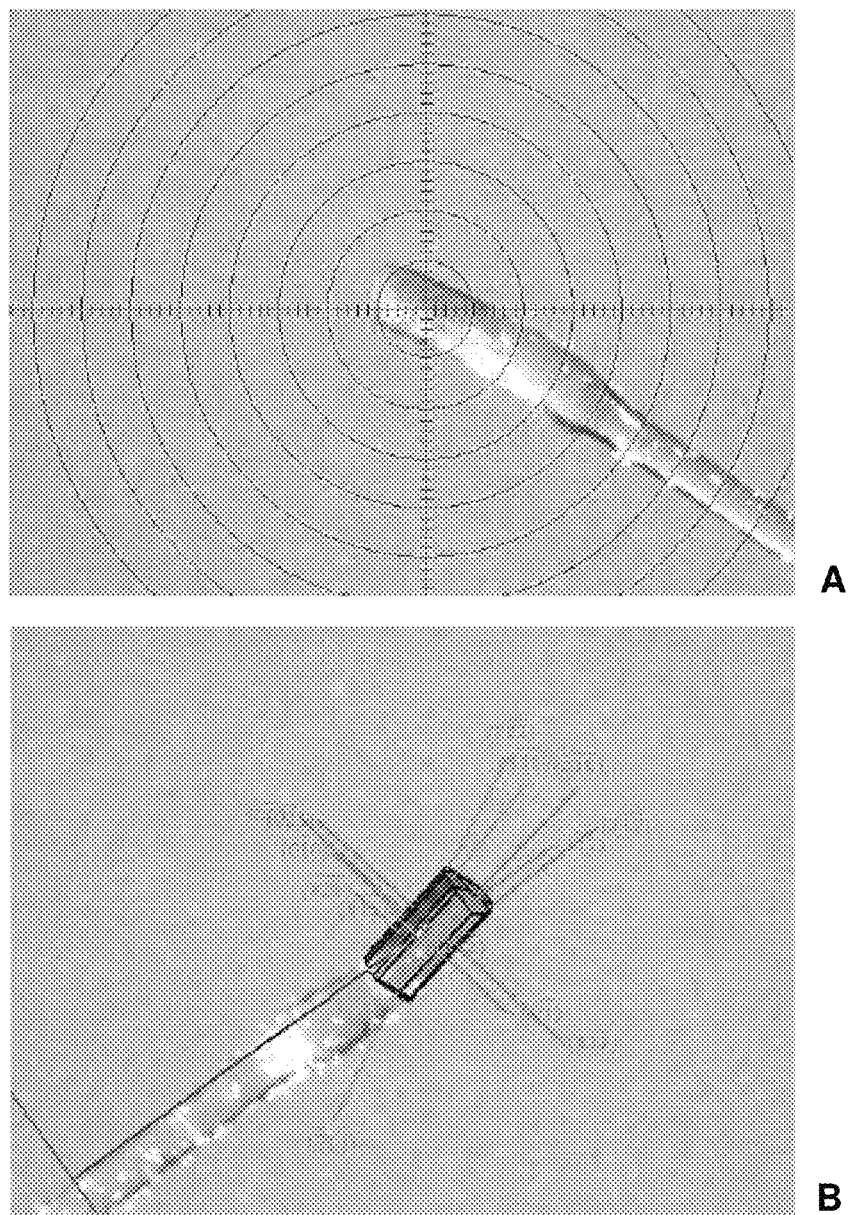
FIG. 7 (A)-(B) shows Crystal data for monomeric yellow Pd(DECO)$_2$ (complex 6).

Crystals of all studied compounds were mounted on a thin glass fiber, or plastic MiTeGen holders attached to the copper-pin positioned on the goniometer head of the Bruker APEX 2 diffractometer, equipped with a SMART CCD area detector. The intensity data were collected at 120 K in co scan mode using the Mo tube (Kα radiation; λ=0.71073 Å) with a highly oriented graphite monochromator. Intensities were integrated from 4 series of 364 exposures, each covering 0.5° in ω at 20 seconds of acquisition time, with the total data set being a sphere. The space group determination was done with the aid of XPREP software. The absorption correction was performed by a crystals face indexing procedure with a video microscope followed by numerical input into the SADABS program that was included in the Bruker AXS software package. The structures can be seen in FIGS. 5 (complex 3), 6 (complex 4), and 7 (complex 6). Each figure shows a videomicroscope photograph of a single crystal of the complex (A) and its face indexing (B).

All structures were solved by direct methods and refined by least squares on weighted F2 values for all reflections using the SHELXTL program. In the structures of the free ligand HDECO, 1, and in its $Pd(DECO)_2$ complex 6 all H-atoms were placed in calculated positions in accordance with the hybridization state of a hosting carbon atom and refined isotropically. However, in the structure of yellow $Pt(DECO)_2$ (3) all H-atoms were found in the electron difference map and were refined anisotropically. No apparent problems or complications were encountered during structures solutions and refinement. Crystal data for 1, 3, 4 and 6 are summarized below in Table 3, while selected bond lengths and valence angles are presented in Table 4. Representative drawing of the crystal structures and packing diagrams was done using the ORTEP and Mercury software packages.

TABLE 3

Crystal data for all studied compounds

| | HDECO, 1 | $Pd(DECO)_2$, 6 | $Pt(DECO)_2$, monomer, 3 | $Pt(DECO)_2$, dimer, 4 |
|---|---|---|---|---|
| Empirical formula | $C_7H_{11}N_3O_2$ | $C_{14}H_{20}N_6O_4Pd$ | $C_{14}H_{20}N_6O_4Pt$ | $C_{14}H_{20}N_6O_4Pt$ |
| Color | colorless | bright yellow | yellow | dark red |
| Crystal size, mm | 0.06 × 0.1 × 0.3 | 0.29 × 0.17 × 0.09 | 0.23 × 0.13 × 0.05 | 0.20 × 0.25 × 0.35 |
| Formula weight | 169.19 | 442.76 | 531.45 | 531.45 |
| Temperature, K | 120(2) | 120(2) | 120(2) | 120(2) |
| Crystal system | Monoclinic | Triclinic | Triclinic | Monoclinic |
| Space group, # | P2(1)/c, 14 | P -1, #2 | P -1, #2 | C2/c, #15 |
| Unit cell, Å, ° | a = 8.5424(10) | a = 7.1454(6) | a = 7.2038(4) | a = 27.0687(18) |
| | b = 7.9608(10) | b = 9.1247(7) | b = 9.0996(5) | b = 9.1876(6) |
| | c = 13.2705(16) | c = 13.9509(11) | c = 13.8997(7) | c = 14.3089(10) |
| | α = 90 | α = 98.8470(10) | α = 98.9830(10) | α = 90 |
| | β = 99.060(2) | β = 94.1610(10) | β = 94.6390(10) | β = 102.9600(10) |
| | γ = 90 | γ = 106.5090(10) | γ = 106.3810(10) | γ = 90 |
| Unit cell volume, Å³ | 891.19(19) | 855.21(12) | 855.91(8) | 3467.9(4) |
| Z | 4 | 2 | 2 | 8 |
| Density (calc.) Mg/m³ | 1.261 | 1.719 | 2.062 | 2.036 |
| Absorp. coeff.. $mm^{-1}$ | 0.095 | 1.118 | 8.230 | 8.125 |
| F(000) | 360 | 448 | 512 | 2048 |
| Θ range, ° | 2.41 to 27.86 | 1.49 to 26.73 | 1.50 to 28.28 | 1.54 to 30.99 |
| Index ranges | −11 <= h <= 11 | −9 <= h <= 9 | −9 <= h <= 9 | −39 <= h <= 38 |
| | −10 <= k <= 10 | −11 <= k <= 11 | −12 <= k <= 12 | −13 <= k <= 13 |
| | −17 <= l <= 17 | −17 <= l <= 17 | −18 <= l <= 18 | −20 <= k <= 20 |
| Structures solution | | Direct | | |
| Reflections collected | 9987 | 10130 | 11281 | 26242 |
| Independent reflections | 2123 [R(int) = 0.0470] | 3599 [R(int) = 0.0183] | 4234 [R(int) = 0.0228] | 5510 [R(int) = 0.0364] |
| Completeness to Θ, (%) | 27.86° (99.6) | 26.73° (98.9) | 28.28° (99.4) | 30.99 (99.6) |
| Absorption correction | None | Numerical | Numerical | Numerical |
| $T_{max}$ and $T_{min}$ | n/a | 1.000 and 0.9176 | 0.6843 and 0.3036 | 0.2930 and 0.1630 |
| Refinement method | | Full-matrix least-squares on $F^2$ | | |
| Data/restraints/parameters | 2123/0/112 | 3599/0/230 | 4234/0/306 | 5510/0/230 |
| Goodness-of-fit on $F^2$ | 1.030 | 1.109 | 1.114 | 1.115 |
| Final R indices [I > 2σ(I)] | R1 = 0.0404, | R1 = 0.0185 | R1 = 0.0195 | R1 = 0.0258 |
| | wR2 = 0.0904 | wR2 = 0.0405 | wR2 = 0.0366 | wR2 = 0.046 |
| R indices (all data) | R1 = 0.0622, | R1 = 0.0198 | R1 = 0.0225 | R1 = 0.0375 |
| | wR2 = 0.1011 | wR2 = 0.0412 | wR2 = 0.0374 | wR2 = 0.0496 |
| Largest peak/hole, e.Å⁻³ | 0.241/−0.230 | 0.412/−0.610 | 0.987/−1.582 | 1.599/−1.088 |
| Structures volume, Å³(%): | 547.3 (61.4) | 560.8 (65.6) | 557.8 (65.2) | 2256.7 (65.1) |

TABLE 4

Selected values of bond lengths and valence angles

| Compound | Bond length, Å | | Valence angle, ° | |
|---|---|---|---|---|
| HDECO (1) | C(1)—N(1) | 1.2844(17) | N(1)—C(1)—C(2) | 122.72(12) |
| | N(1)—O(1) | 1.3719(14) | N(1)—C(1)—C(3) | 120.24(12) |
| | C(1)—C(2) | 1.4453(19) | C(2)—C(1)—C(3) | 116.37(11) |
| | C(1)—C(3) | 1.5031(18) | N(2)—C(2)—C(1) | 179.28(16) |
| | C(2)—N(2) | 1.1449(18) | O(2)—C(3)—N(3) | 124.71(12) |
| | C(3)—O(2) | 1.2407(15) | O(2)—C(3)—C(1) | 115.34(12) |
| | C(3)—N(3) | 1.3269(17) | C(1)—N(1)—O(1) | 111.53(11) |
| | C(4)—N(3) | 1.4726(17) | C(3)—N(3)—C(4) | 124.91(11) |
| | C(6)—N(3) | 1.4743(17) | C(3)—N(3)—C(6) | 118.29(11) |
| | | Organic ligand: | | |
| Yellow Pt(DECO)$_2$ monomer, (3) | C(1)—N(1) | 1.359(4) | N(1)—C(1)—C(2) | 117.4(3) |
| | C(8)—N(4) | 1.352(4) | N(4)—C(8)—C(9) | 118.8(2) |
| | N(1)—O(1) | 1.249(3) | N(1)—C(1)—C(3) | 113.7(2) |
| | N(4)—O(4) | 1.249(3) | N(4)—C(8)—C(10) | 114.5(2) |
| | C(1)—C(2) | 1.426(4) | C(2)—C(1)—C(3) | 128.8(3) |
| | C(8)—C(9) | 1.416(4) | C(9)—C(8)—C(10) | 126.2(3) |
| | C(1)—C(3) | 1.463(4) | N(2)—C(2)—C(1) | 177.6(3) |
| | C(8)—C(10) | 1.455(4) | N(5)—C(9)—C(8) | 176.3(3) |
| | C(2)—N(2) | 1.150(4) | O(2)—C(3)—N(3) | 118.9(3) |
| | C(9)—N(5) | 1.147(4) | O(3)—C(10)—N(6) | 119.6(2) |
| | C(3)—O(2) | 1.283(3) | O(2)—C(3)—C(1) | 115.9(3) |
| | C(10)—O(3) | 1.280(3) | O(3)—C(10)—C(8) | 116.4(2) |
| | C(3)—N(3) | 1.321(4) | O(1)—N(1)—C(1) | 119.9(2) |
| | C(10)—N(6) | 1.325(3) | O(4)—N(4)—C(8) | 120.4(2) |
| | | Metal center: | | |
| | N(1)—Pt(1) | 1.961(2) | N(1)—Pt(1)—N(4) | 102.81(10) |
| | N(4)—Pt(1) | 1.969(2) | N(1)—Pt(1)—O(2) | 80.54(9) |
| | O(2)—Pt(1) | 2.0233(19) | N(4)—Pt(1)—O(2) | 176.14(8) |
| | O(3)—Pt(1) | 2.0321(18) | N(1)—Pt(1)—O(3) | 175.22(9) |
| | | | N(4)—Pt(1)—O(3) | 81.05(9) |
| | | | O(2)—Pt(1)—O(3) | 95.51(7) |
| | | Organic ligand: | | |
| Red Pt(DECO)$_2$ Dimer(4) | C(1)—N(1) | 1.357(4) | N(1)—C(1)—C(2) | 117.6(3) |
| | C(8)—N(4) | 1.354(4) | N(4)—C(8)—C(9) | 117.6(3) |
| | N(1)—O(1) | 1.239(3) | N(1)—C(1)—C(3) | 114.8(3) |
| | N(4)—O(4) | 1.240(3) | N(4)—C(8)—C(10) | 113.9(3) |
| | C(1)—C(2) | 1.423(5) | C(2)—C(1)—C(3) | 127.6(3) |
| | C(8)—C(9) | 1.428(4) | C(9)—C(8)—C(10) | 128.2(3) |
| | C(1)—C(3) | 1.451(5) | N(2)—C(2)—C(1) | 179.4(5) |
| | C(8)—C(10) | 1.457(5) | N(5)—C(9)—C(8) | 178.0(4) |
| | C(2)—N(2) | 1.144(5) | O(2)—C(3)—N(3) | 119.0(3) |
| | C(9)—N(5) | 1.144(4) | O(4)—C(10)—N(6) | 118.4(3) |
| | C(3)—O(2) | 1.284(4) | O(2)—C(3)—C(1) | 116.1(3) |
| | C(10)—O(3) | 1.290(4) | O(4)—C(10)—C(8) | 116.4(3) |
| | C(3)—N(3) | 1.322(4) | O(1)—N(1)—C(1) | 120.4(3) |
| | C(10)—N(6) | 1.322(4) | O(3)—N(4)—C(8) | 120.4(3) |
| | | Metal center: | | |
| | N(1)—Pt(1) | 1.969(3) | N(1)—Pt(1)—N(4) | 102.26(11) |
| | N(4)—Pt(1) | 1.969(3) | N(1)—Pt(1)—O(2) | 80.60(10) |
| | O(2)—Pt(1) | 2.029(2) | N(4)—Pt(1)—O(2) | 177.04(10) |
| | O(4)—Pt(1) | 2.036(2) | N(1)—Pt(1)—O(4) | 172.71(10) |
| | | | N(4)—Pt(1)—O(3) | 80.60(10) |
| | | | O(2)—Pt(1)—O(4) | 96.48(9) |
| | | Organic ligand: | | |
| Yellow, monomer Pd(DECO)$_2$ (6) | C(1)—N(1) | 1.345(2) | N(1)—C(1)—C(2) | 118.73(15) |
| | C(8)—N(4) | 1.350(2) | N(4)—C(8)—C(9) | 117.26(15) |
| | N(1)—O(1) | 1.2464(18) | N(1)—C(1)—C(3) | 114.93(15) |
| | N(4)—O(3) | 1.2479(18) | N(4)—C(8)—C(10) | 114.25(15) |
| | C(1)—C(2) | 1.427(2) | C(2)—C(1)—C(3) | 125.74(15) |
| | C(8)—C(9) | 1.432(2) | C(9)—C(8)—C(10) | 128.38(16) |
| | C(1)—C(3) | 1.464(2) | N(2)—C(2)—C(1) | 176.3(2) |
| | C(8)—C(10) | 1.469(2) | N(5)—C(9)—C(8) | 177.5(2) |
| | C(2)—N(2) | 1.149(2) | O(2)—C(3)—N(3) | 119.91(15) |
| | C(9)—N(5) | 1.150(2) | O(4)—C(10)—N(6) | 119.00(15) |
| | C(3)—O(2) | 1.280(2) | O(2)—C(3)—C(1) | 116.62(15) |
| | C(10)—O(4) | 1.278(2) | O(4)—C(10)—C(8) | 116.22(15) |
| | C(3)—N(3) | 1.323(2) | O(1)—N(1)—C(1) | 121.15(15) |
| | C(10)—N(6) | 1.326(2) | O(3)—N(4)—C(8) | 120.90(14) |

TABLE 4-continued

Selected values of bond lengths and valence angles

| Compound | Bond length, Å | | Valence angle, ° | |
|---|---|---|---|---|
| Metal center: | | | | |
| | N(1)—Pd(1) | 1.9846(15) | N(4)—Pd(1)—N(1) | 102.11(6) |
| | N(4)—Pd(1) | 1.9798(14) | N(4)—Pd(1)—O(4) | 80.67(5) |
| | O(2)—Pd(1) | 2.0358(12) | N(1)—Pd(1)—O(4) | 176.52(5) |
| | O(4)—Pd(1) | 2.0300(12) | N(4)—Pd(1)—O(2) | 175.55(5) |
| | | | N(1)—Pd(1)—O(2) | 81.46(5) |
| | | | O(4)—Pd(1)—O(2) | 95.67(5) |

Ligands.

All six depicted cyanoximes in FIG. 1 were obtained in high yield using major reactions shown below.

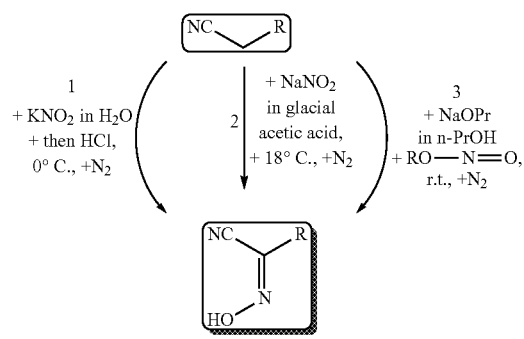

The cyanoxime ligand—2-oximino-2-cyano-N,N'-diethyl acetamide (1, further HDECO)—was obtained in high yield according to known procedures from the respective diethylamide as shown below. The pure compound represents clear, ice-looking crystals soluble in most organic solvents except hydrocarbons.

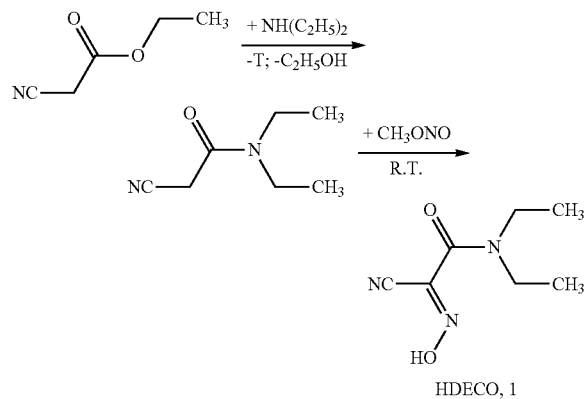

HDECO, 1

Yield: 68%; m.p.=87-90° C.; $R_f$=0.32 in EtOAC/hexane=1:1 mixture. Analysis: for $C_7H_{11}N_3O_2$ calculated (found), %: C—49.70 (49.53); H—6.55 (6.61); N—24.84 (24.77). UV-visible spectrum, $\lambda_{nm}$ ($\epsilon$, $M^{-1} \cdot cm^{-1}$): $CH_3OH$—226 (10331; $\pi \to \pi^*$), deprotonated $DECO^-$ (as $NHEt_3^+$ salt): 394 (73; $n \to \pi^*$). The $^1H$ NMR, ppm, in dmso-$d_6$: 1.16 (3H, t, methyl group), 1.12 (3H, t, methyl group), 3.40 (2H, quart, methylene), 3.47 (2H, quart, methylene), 14.21 (1H, s, oxime); value of $^3J(H-H)$ coupling constant in the ethyl group is 7.1 Hz. The $^{13}C$ NMR, ppm: two methyl groups at 12.74 ($CH_3$), 14.63 ($CH_3$), two ethyl groups at 40.95 ($CH_2$), 43.99 ($CH_2$), 127.83 (C=N—OH), 109.77 (CN), 158.82 (amide). IR spectrum, KBr pellet, $cm^{-1}$: 3205—$\upsilon$(OH); 2992—$\upsilon^{as}$(CH); 2830—$\upsilon^s$(CH); 2250—$\upsilon$(CEN); 1630—$\upsilon$(CO, amide-I); 1478—$\upsilon$(C=N, oxime); 1468—$\upsilon$(CO, amide-II); 1034—$\upsilon$(N—O).

Figure 8:
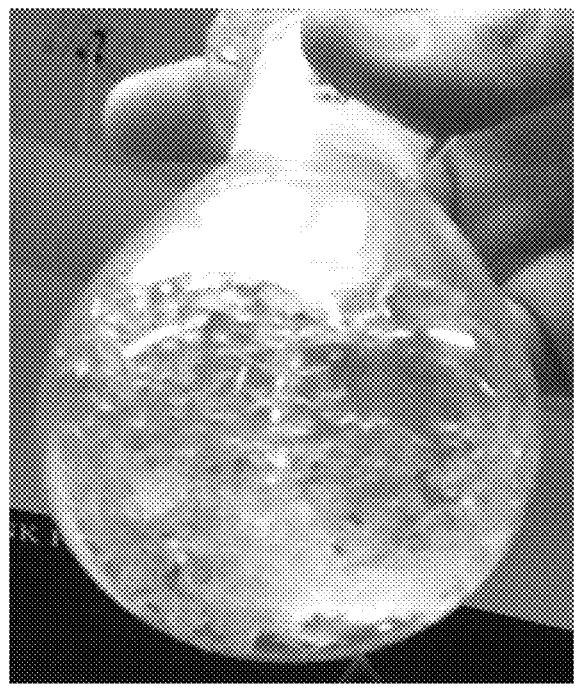
FIG. 8 shows a flask with crystallized pure cyanoxime H(DECO).
Figure 9:
FIG. 9 shows the filtering of pure, 1D-polymeric [Pt(DECO)$_2$]$_n$ complex 5, that appeared as a very fine green powder.
Figure 10:
FIG. 10 is a black and white photograph of yellow microcrystalline powder of Pd(DECO)$_2$ complex 6, which was obtained as non-aggregating compound for control purposes.

Actual photographs of some of the compounds made are shown in FIGS. 8-10. FIG. 8 shows a flask with crystallized pure cyanoxime H(DECO), 1, used for the NMR spectroscopic studies and synthesis of complexes. FIG. 9 shows the filtering of pure, 1D-polymeric $[Pt(DECO)_2]_n$ complex 5, that appeared as a very fine green powder. FIG. 10 shows the microcrystalline powder of $Pd(DECO)_2$ complex 6, which appeared as a yellow powder, and was obtained as a non-aggregating compound for control purposes.

Metal Complexes.

Figure 11:
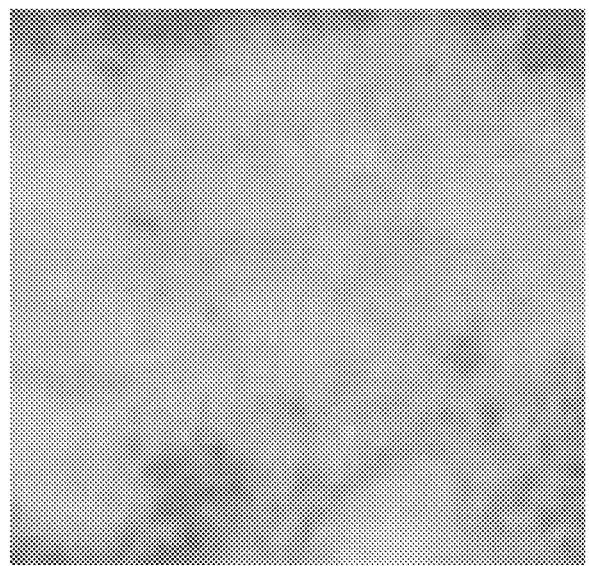
FIG. 11 is a photograph of a pure sample of unoxidized K$_2$[Pt(CN)$_4$] under 40× magnification.
Figure 12:
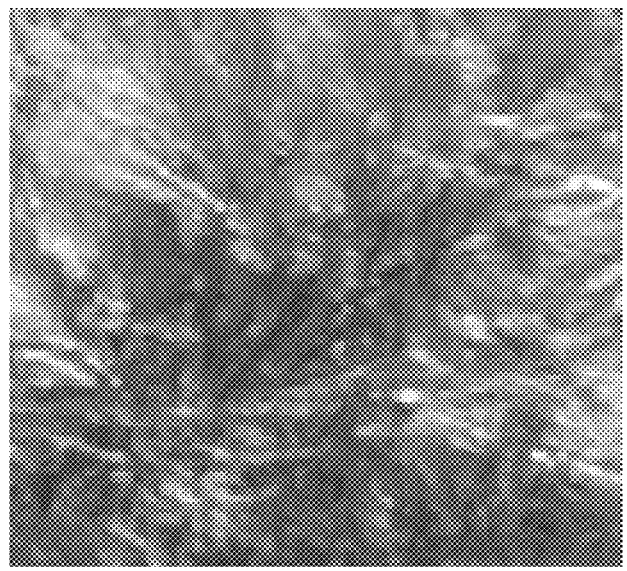
FIG. 12 is a photograph of brominated K$_2$[Pt(CN)$_4$]×0.3Br, H$_2$O under 40× magnification, having an intermetallic distance of 2.89 Ångstrom.
Figure 13:
FIG. 13 is a pure sample of [Pt(NH$_3$)$_4$][PtCl$_4$] under 40× magnification, having an intermetallic distance of 3.25 Ångstrom.

Preparation of the Magnus' Green Salt, (MGS), KCP, and POCP (Krogman's salt) was carried out according to published procedures. Their microscope photographs (at 40× magnification) are shown in FIGS. 11-13. Although not shown in color in the figures, the KCP appeared as lustrous off-white crystals (FIG. 11); the POCP appeared as copper-like shiny needles (FIG. 12); and the MGS appeared as green crystals (FIG. 13). All of these complexes were used as standards of known 1D solids with well-defined Pt---Pt distances and acted as model compounds to compare with the newly obtained complexes 3-6. The POCP sample represents mixed valence Pt(II)/Pt(IV) complex that exhibits metallic conductivity, while KCP and MGS are very poor electric conductors at the bottom range of semiconductors.

For the synthesis of 6, 0.330 g (1.95 mM) of H(DECO) were placed in a 100 mL Erlenmeyer flask and 5 mL of distilled water was added to the flask. Pure ligand 1 [H(DECO)] is not well soluble in water, but after being deprotonated it becomes well soluble and reacts with transition metals salts (Scheme 1, shown below). Therefore, the required stoichiometric amount of 1.01 M KOH solution (1.93 mL) was added to the sludge of compound 1 in water. The cyanoxime dissolved and the reaction mixture immediately changed color to bright yellow. A solution of 0.318 g (0.98 mM) of $K_2[PdCl_4]$ in 5 mL of water was added drop-wise to a yellow solution of 2 under intense stirring. A thick yellow precipitate formed instantaneously, and, after ~5 min of stirring, it was filtered, washed three times with water, and then dried in a desiccator charged with concentrated H2SO4. Elemental analysis found (calculated) for $PdC_{14}H_{22}N_6O_4$, %: N—18.24 (18.24); C—37.05 (37.05); H—4.50 (4.50). IR spectrum, KBr pellet, $cm^{-1}$: 2983—$\upsilon^{as}$(CH); 2940—$\upsilon^s$(CH); 2211—$\upsilon$(CEN); 1631—$\upsilon$(CO, amide-I); 1440—$\upsilon$(CNO, oxime); 1579—$\upsilon$(CO, amide-II); 1200—$\upsilon$(CNO). Complex 6 is soluble in $CH_3CN$, well soluble in DMF, DMSO, Py and its homologs, but not well soluble in acetone and alcohols.

For the synthesis of Pt(DECO)$_2$, 0.217 g (1.28 mM) of 1 in 8 mL of water was treated with 1.28 mL of 1.01 M KOH solution, forming a yellow solution of a deprotonated cyanoxime 2 to which 0.268 g (0.65 mM) of K$_2$PtCl$_4$ in 5 mL was added. When all components were mixed, the formation of the Pt(DECO)$_2$ complex involving several stages was observed after an extended period of time. After ~24 hours a very fine dark-green precipitate (FIG. 13) was filtered, washed three times with water and then dried in a vacuum dessicator under concentrated H$_2$SO$_4$. The elemental analysis found (calculated) for green-form PtC$_{14}$H$_{22}$N$_6$O$_4$, 5, %: N—15.75 (15.78); C—31.52 (31.46); H—4.16 (4.03). IR spectrum, KBr pellet, cm$^{-1}$: 2985—$\upsilon^{as}$(CH); 2943—$\upsilon_s$(CH); 2213—$\upsilon$(CEN); 1709—$\upsilon$(CO, carbonyl); 1622; 1442—$\upsilon$(CNO), oxime); 1585—$\upsilon$(CO, amide-II); 1227—$\upsilon$(CNO). The dark-green form, compound 5, is not soluble in water, but has some solubility in alcohols, slowly dissolves in DMSO (with the help of an ultrasound bath), CH$_2$Cl$_2$ and CHCl$_3$ forming at first dark-red solutions of a dimer 4. Also, complex 5 is well soluble in pyridine and its homologs with the formation of yellow solutions.

The yellow form 3 of the same complex can be obtained after the dissolution of the green form in CH$_3$CN or DMF, which slowly changes color to red and yellow-orange. Crystals of 3 were grown from an overlaid with heptane acetonitrile solution, or by the vapor-diffusion method when ether slowly dilutes solution. In both cases, nicely shaped yellow prism-type crystals can be isolated in a moderate yield. The elemental analysis found (calculated) for the yellow form 3 is as follows: for PtC$_{14}$H$_{22}$N$_6$O$_4$, %: N—15.75 (15.89); C—31.52 (31.42); H—4.16 (4.27). Data of UV-visible spectra for all synthesized compounds are summarized below in Table 5.

TABLE 5

UV-Vis spectroscopy measurements (summary)
Data of UV-Vis spectroscopy measurements for HDECO (1), its anion, DECO$^-$ (2, as NHEt$_3^+$ salt), and yellow monomeric Pd(DECO)$_2$ (6) and Pt(DECO)$_2$ (3).

| Compound | Solvent | C (mM) | $\lambda_{max}$ (nm) | $\varepsilon$ (M$^{-1}$·cm$^{-1}$) | Comment |
|---|---|---|---|---|---|
| Organic ligands: | | | | | |
| 1 | H$_2$O | n/a | n/a | n/a | insoluble in water |
| 2 | H$_2$O | 2.92 | 375 | 62 | n → π* |
| 1 | CH$_3$OH | 1.58 | 226 | 10330 | π → π* |
| 2 | CH$_3$OH | 1.58 | 394 | 73 | n → π* |
| 1 | C$_2$H$_5$OH | 1.52 | 228 | 9200 | π → π* |
| 2 | C$_2$H$_5$OH | 1.52 | ~387 | (shoulder) | n → π* |
| 1 | n-C$_3$H$_7$OH | 2.67 | 229 | 3625 | π → π* |
| 2 | n-C$_3$H$_7$OH | 2.67 | 285 | 3940 | π → π* |
| | | | 393 | 28 | n → π* |
| 2 | DMF | 1.53 | 472 | 47 | visible region only! UV not transparent |
| 2 | DMSO | 4.01 | 469 | 60 | visible region only! UV not transparent |
| Metal complexes: | | | | | |
| 6 | DMSO | 1.0 | 311 | 18120 | π → π* |
| | | | 368 | 16400 | π → π* |
| 3 | DMSO | 1.0 | 315 | 12900 | π → π* |
| | | | 381 | 9550 | π → π* |

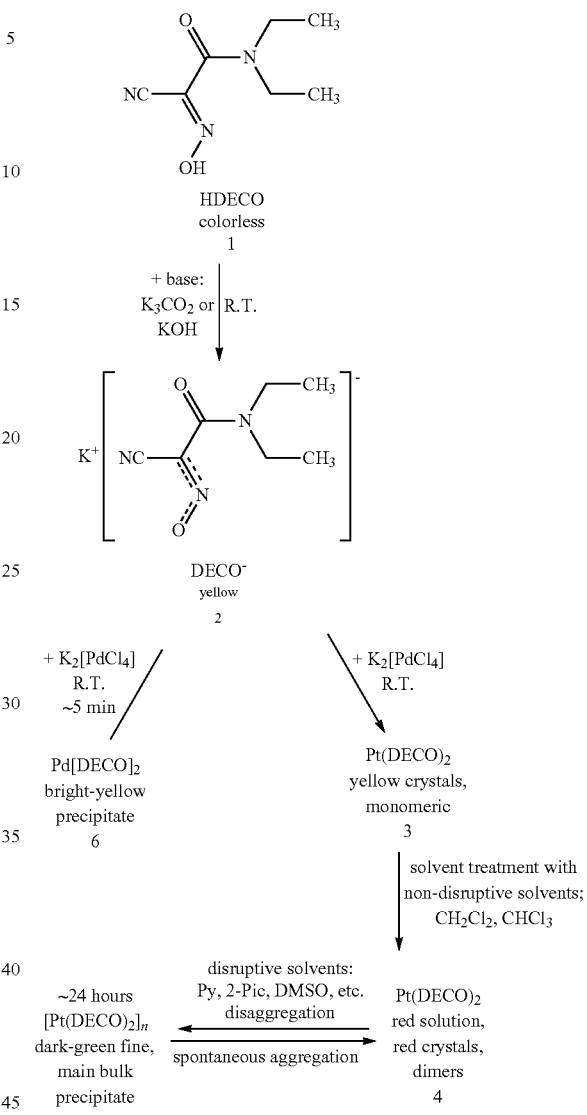

Scheme 1
Scheme 1. Synthetic route to metallocyanoximates and their properties.

Scheme 1

Results and Discussion

Inter-Transformation of Complexes in Pt-DECO System:

One of the most remarkable observations during the Pt(DECO)$_2$ synthesis (Scheme 1, shown above) is the color change. The ligand H(DECO) 1 itself is colorless, but turns into the bright yellow anion DECO$^-$ 2 in the presence of a base. Shortly after addition of the Pt salt the color of the solution changes to red, then slowly the reaction mixture becomes turbid and a very fine dark-green precipitate starts to form in the still red-colored solution. The green-colored precipitate makes a bulk of the pure Pt complex 5 without any admixture of the red or yellow complexes 4 and 3, which are polymorphs.

Figure 14:
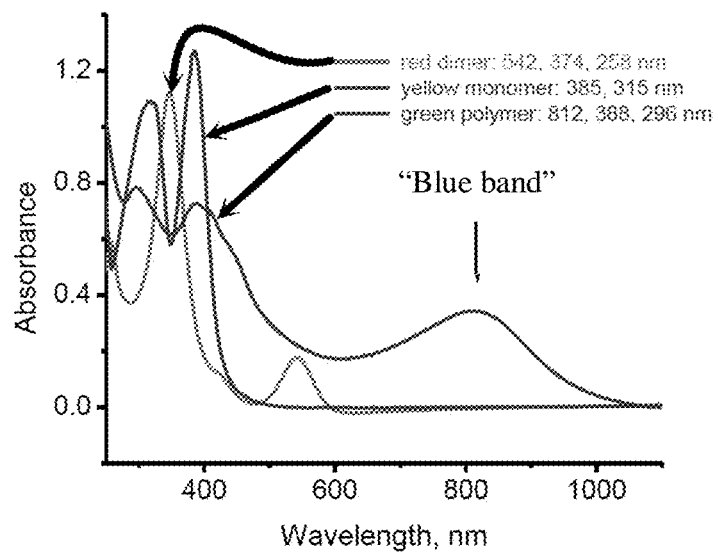
FIG. 14 is a graph of UV-Vis absorption spectra of Pt-DECO complexes in solutions: polymer 5 in n-PrOH, dimer 4 in CHCl$_3$ and monomer 3 in diethylacetamide; T=+20° C. An arrow shows the "blue band" in the NIR region.

The spectra of the products in solutions are shown in FIG. 14. The vertical arrow marked "blue band" shows the "blue band" in the NIR region. The green form of Pt(DECO)$_2$, 5, may be completely converted into the yellow monomeric form 3 by a simple dissolution of the complex in donor solvents such as pyridine and DMSO. Finally, all three forms of Pt(DECO)$_2$ can be isolated. The UV-Vis spectra of the monomer 3 were similar to those for anionic ligand 2 in the same solvent as indicated in the above Table 5. The red (4) and yellow (3) forms can be obtained from the green one using triturating of the solids with solvents such as CH$_3$CN, CHCl$_3$, CH$_2$Cl$_2$, followed either by controlled crystallization, or mechanical separation. The process of disaggregation appears to be reversible, suggesting spontaneous formation of the dark-green Pt(DECO)$_2$ 5 from the red 4 or yellow complex 3 upon solvent evaporation. The Pt-complexes overall remain stable after dissolution. Electrical conductivity in DMSO (as a disruptive metallophilic contacts solvent that dissolves all the studied compounds) showed non-conductive solutions which implies that the complexes keep their Pt-ligand integrity, as indicated above in Table 2. For comparison, the bright yellow Pd(DECO)$_2$, 6, complex instantly forms upon mixing of stoichiometric amounts of 2 and K$_2$PdCl$_4$ in water.

Figure 15A:
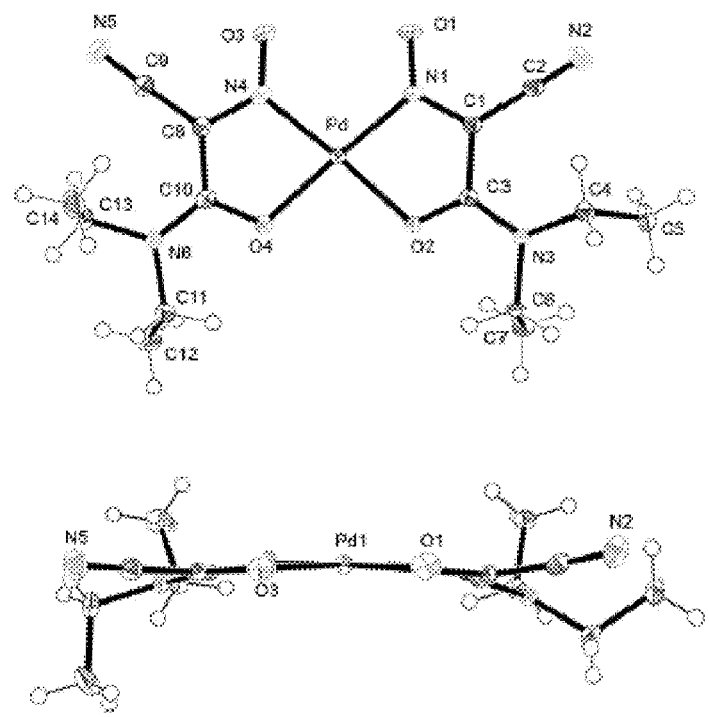
FIG. 15A shows the molecular structure and numbering scheme for Pd(DECO)$_2$, 6, shown in two orthogonal views.
Figure 15B:
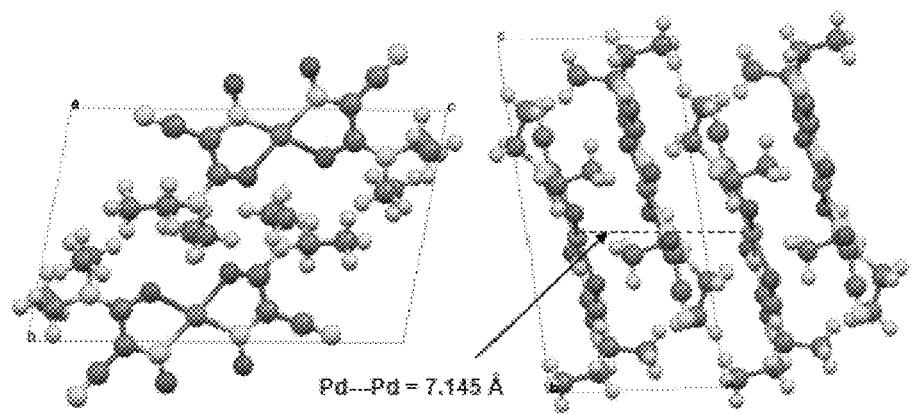
FIG. 15B shows perspective views of the two unit cells in FIG. 15A along different directions.
Figure 16:
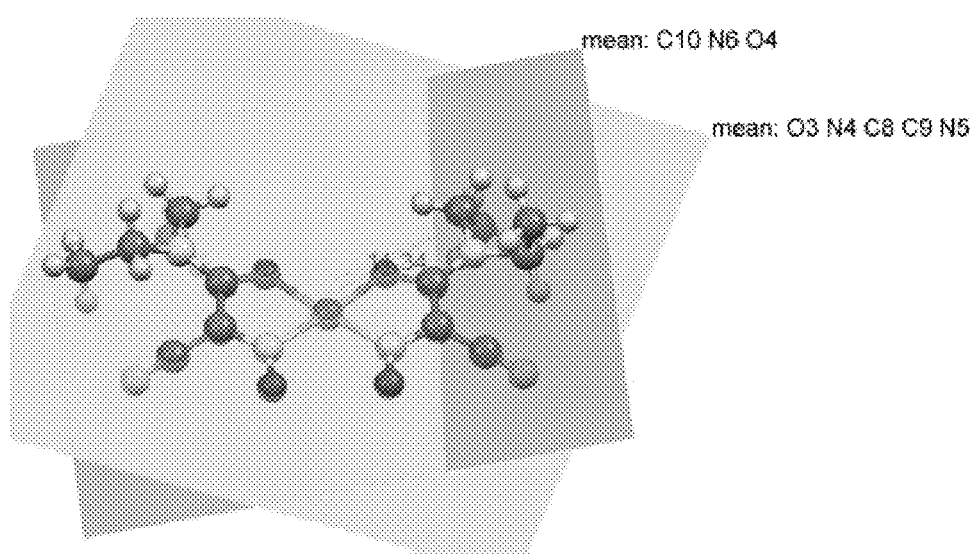
FIG. 16 shows the geometry of the cyanoxime anion DECO— in Pd complex 6.
Figure 17:
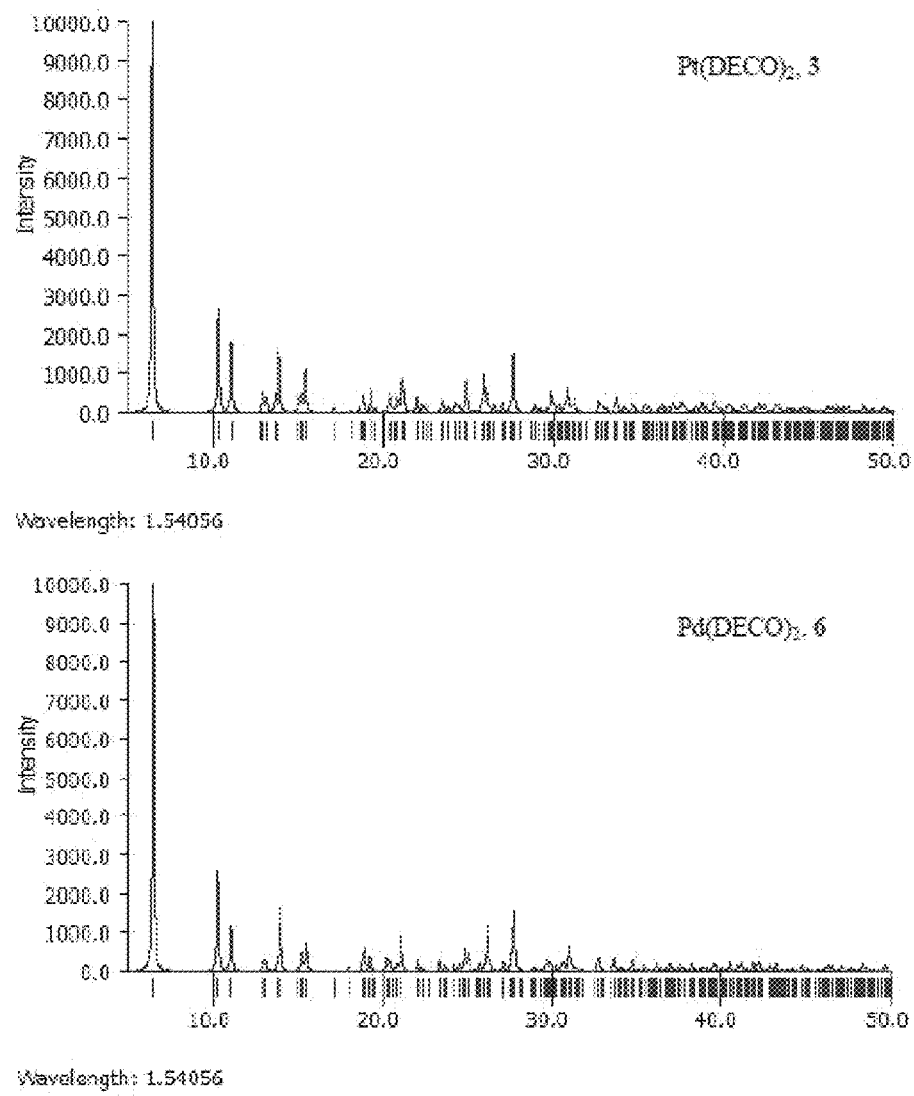
FIG. 17 shows simulated powder XRD patterns for Pt(DECO)$_2$, yellow monomer (3), and yellow Pd(DECO)$_2$ complex (6).
Figure 18:
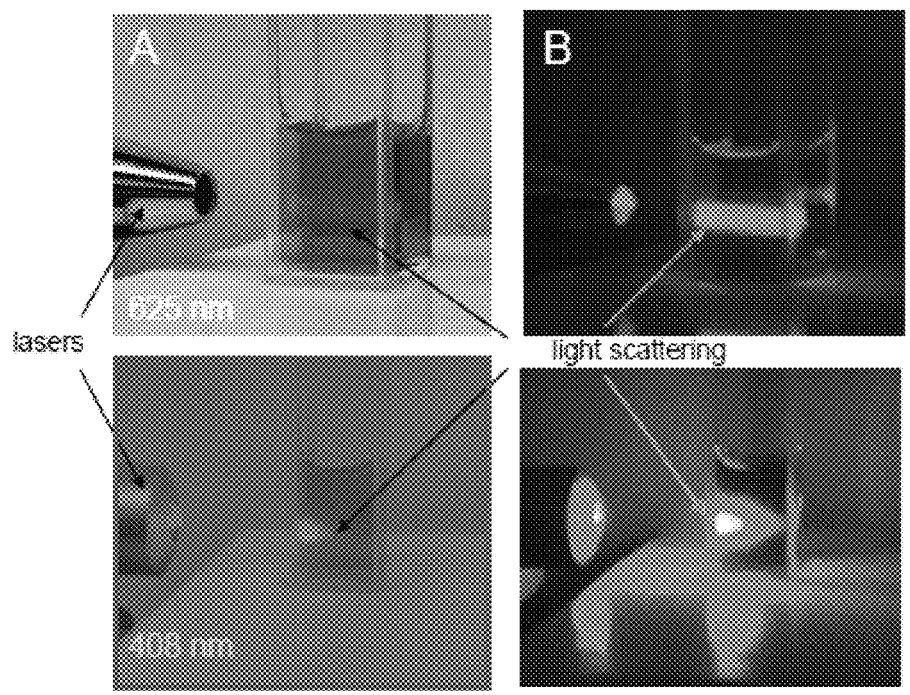
FIG. 18 illustrates the Tindal effect in solutions of green Pt-cyanoxime 5: light scattering from spontaneously self-assembled, aggregated nanosize particles of 1D solids of green [Pt(DECO)$_2$]$_n$ in EtOH at day light (A), and in dark (B). Lasers with two different wavelengths were used.
Figure 19:
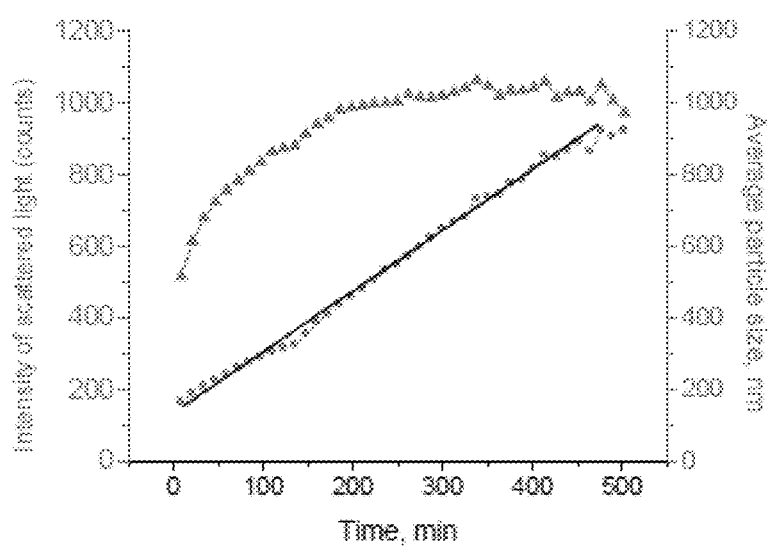
FIG. 19 is a graph illustrating the kinetics of the particles size growth in solution of dark-green 1D polymeric complex 5.

Compound 6 was prepared as a structurally similar, but non-aggregating model complex used as a control. FIG. 15A shows the molecular structure and numbering scheme for Pd(DECO)$_2$, 6, shown in two orthogonal views. FIG. 15B shows perspective views of two unit cells along different directions. FIG. 16 shows the geometry of the cyanoxime anion DECO in Pd complex 6. Simulated powder XRD patterns (based on single-crystal diffraction CIF data) for monomeric Pd and Pt-cyanoximates containing DECO anion show that both complexes are isostructural (FIG. 17). Moreover, the dimension of aggregates formed is in the nanoscale as is evident from their light scattering (Tindal effect) (FIG. 18) and particles size growth (FIG. 19). The linear trend in increase of its size suggests the Oswald ripening mechanism of particles growth.

Figure 54:
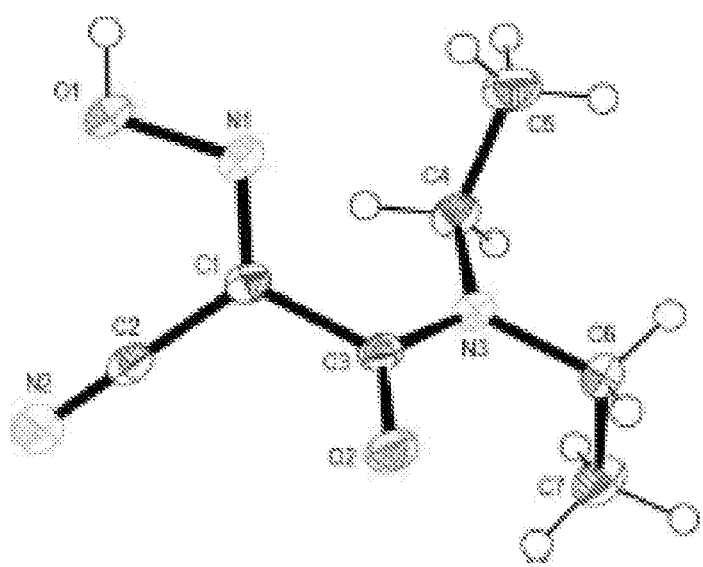
FIG. 54 shows the crystal structure of cyanoxime 1, revealing an adoption of trans-anti oxime geometry in a solid state.
Figure 55:
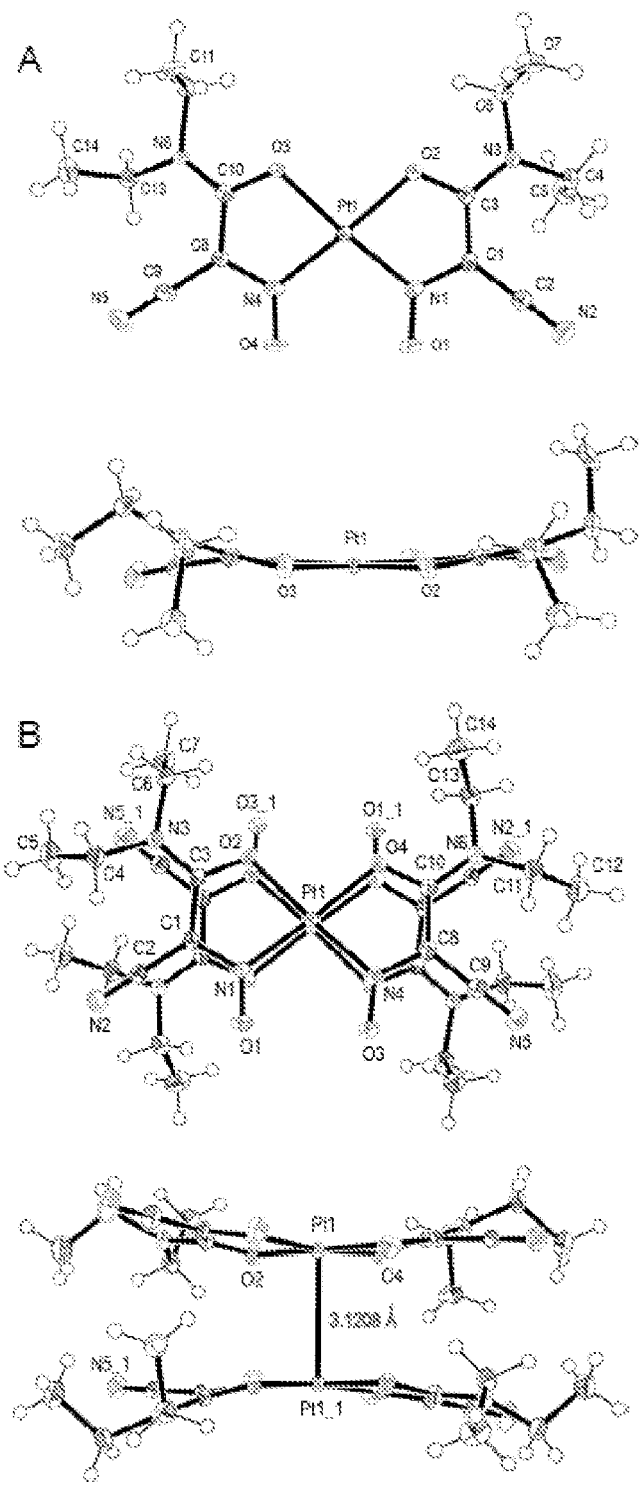
FIG. 55 shows (A) a top and side view of yellow, monomeric Pt(DECO)$_2$.; and (B) a top and side view of red, dimeric [Pt(DECO)$_2$]$_2$.

Structures and NMR Spectra of the New Cyanoxime and its Pd, Pt/DECO Complexes:

The crystal structure of the cyanoxime 1, shown in FIG. 54, reveals an adoption of trans-anti oxime geometry in a solid state. The molecule's core is not planar, with a significant dihedral angle of 53.06° between planes of the cyanoxime and carbonyl fragments due to the steric strain induced by two ethyl groups on the amide fragment. The ligand becomes significantly more planar when coordinated to the Pt-metal as described below, but adopts cis-anti geometry to adjust its chelate binding in the complex. Variable temperature 1H NMR spectra of the free ligand 1 and monomeric complexes 3 (and its Pd-counterpart 6) in dmso-d6 revealed a significant increase of ~6 kJ/mol in the rotation energy barrier of the N'N-diethylamino-fragment around the C—N amide bond in the complex as opposed to the ligand. Such a barrier indicates an increased rigidity of the anion in the Pt complex (Table 1) and explains overall propensity of the flattened complex to dimerization and further polymerization. Crystal structures revealed that different colors of complexes in the Pt-DECO system relate to distinct polymorphs. The crystal and refinement data are presented in Table 3, above. The yellow complex was found to correspond to a monomeric Pt(DECO)$_2$ (3), and adopts a shallow bowl-shape structure, as shown in the crystal structures in FIG. 55. The crystal structures labeled "A" show a top and side view and the numbering scheme of yellow, monomeric Pt(DECO)$_2$ (complex 3). Those labeled "B" show red dimeric [Pt(DECO)$_2$]$_2$ (complex 4) which adopts "head to tail" arrangement.

Figure 20:
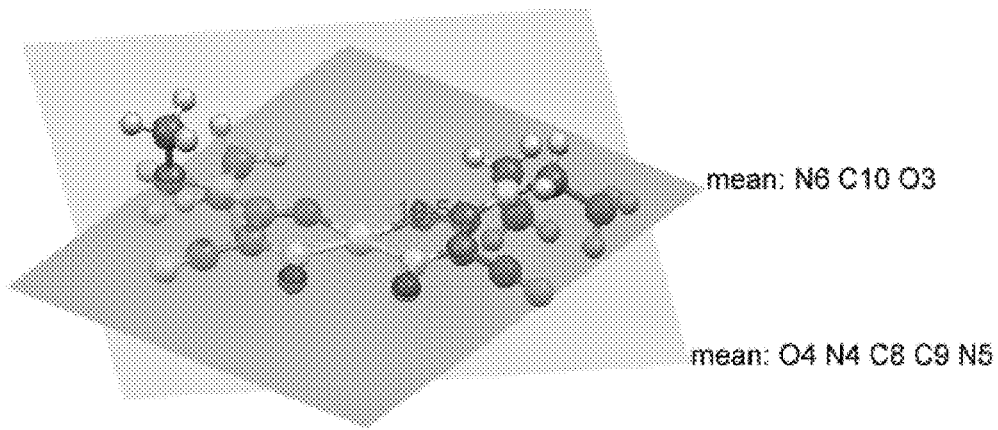
FIG. 20 is an illustration of the geometrical features of the cyanoxime anion DECO— in yellow monomeric Pt(DECO)$_2$ (complex 3).
Figure 21:
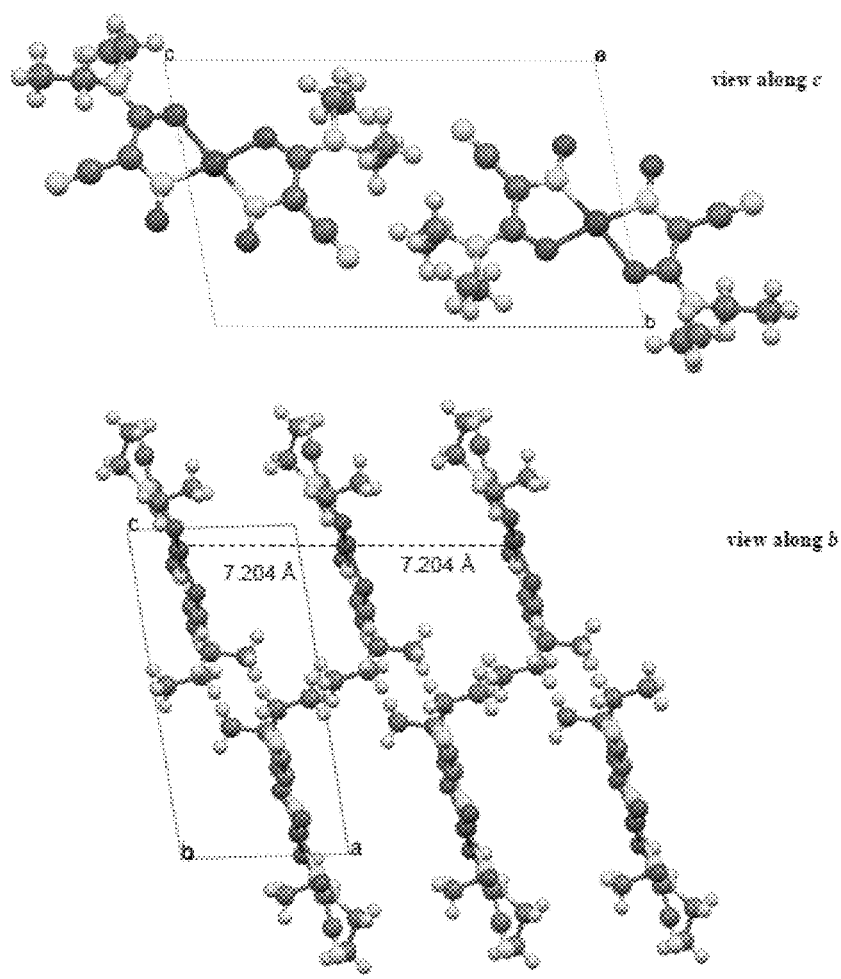
FIG. 21 shows perspective views of three unit cells along different directions. Units of monomeric Pt(DECO)$_2$ complex form slipped columns along the a-axis.

The planar coordination [PtN$_2$O$_2$] environment of metal consists of two chelate ligands in cis-arrangement as illustrated above. Cyanoxime monoanions (DECO—) 2 in all metal complexes presented here (3, 4, 6) are in the nitroso form, as evident from rather short N—O distances of ~1.24 Å compared to much longer ~1.36 Å C—N bonds in the CNO fragment (Table 4, above). The DECO— anion 2 in the monomeric complex 3 is considerably more planar than the structure of 1, with the values of the dihedral angles between the cyanoxime and amide fragments at ~19-22°, and as shown in FIG. 20. The structure represents "slipped stacks" of the cis-Pt(DECO)$_2$ units, where the shortest intermetallic distances are 7.204 Å, suggesting minimum interaction between the Pt centers. Perspective views of three unit cells along different directions are shown in FIG. 21. Units of monomeric Pt(DECO)$_2$ complex form slipped columns along the a-axis. Yellow monomeric Pt-complex 3 and Pd-complex 6 are isostructural, as indicated in FIG. 17.

Figure 22:
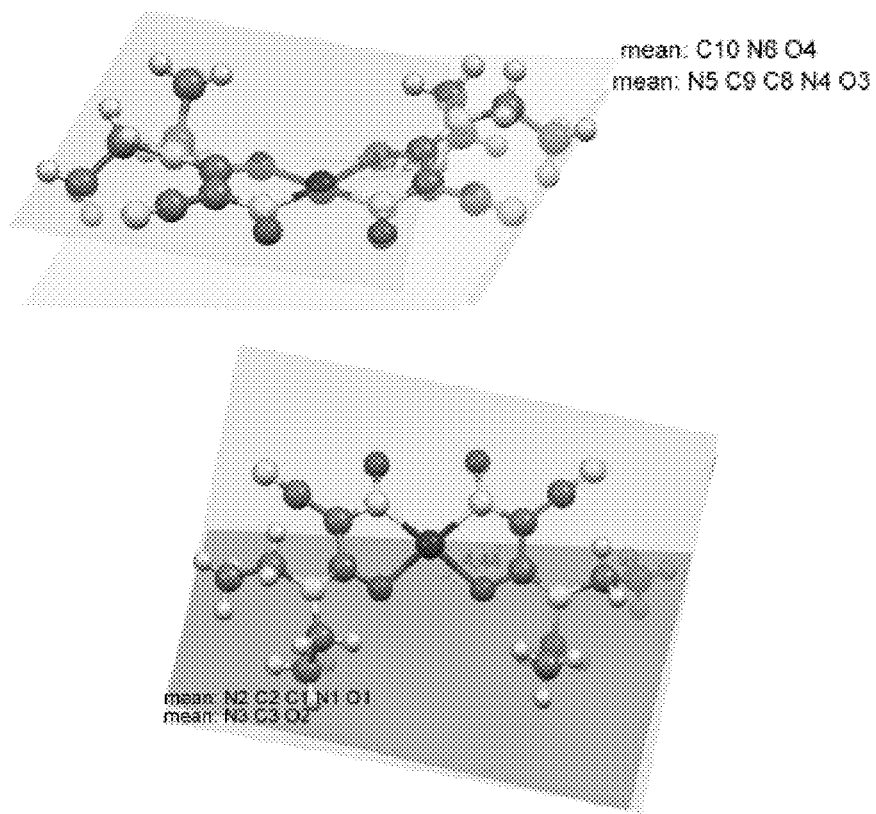
FIGS. 22 and 23 illustrate the geometry of cyanoxime anions DECO$^-$ in the structure of red dimeric Pt(DECO)$_2$ (complex 4).
Figure 23:
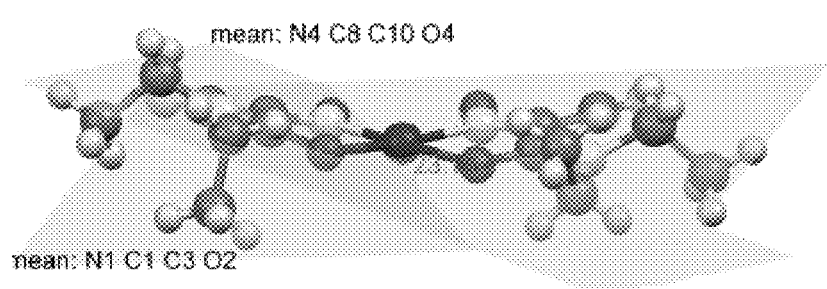

The red-colored complex was found to be the dimeric form of 3—[Pt(DECO)$_2$]$_2$ (4). The crystal and molecular structure of 4 is depicted in the crystal structures labeled "B", above, and the complex's actual appearance is a clear red prism. This centrosymmetric dimer is formed by two bowl-shaped monomeric units of the cis-Pt(DECO)$_2$ that form an elegant, but shallow double-bowl convex structure. The DECO— anion in the structure of 4 is even more planar than in 3, with the values of the dihedral angles between the two cyanoxime and amide fragments decreasing to 4.4 and 14.7°. This is illustrated in FIG. 22. Such increased planarity is apparently due to the demand of the metallophiliic Pt---Pt interactions to form the dimer. Two chelate rings in the cis-Pt(DECO)$_2$ units form the dihedral angle of 23.1° degree, which is responsible for the adoption of the bowl-shape by the individual units but being combined in the dimer takes the convex structure (FIG. 23). The Pt---Pt intermetallic distance of the dimer was found to be 3.1208 Å which is shorter than the sum of ionic and van-der-Waals Pt radii, and significantly shorter than that for other published Pt-dimers.

Figure 24:
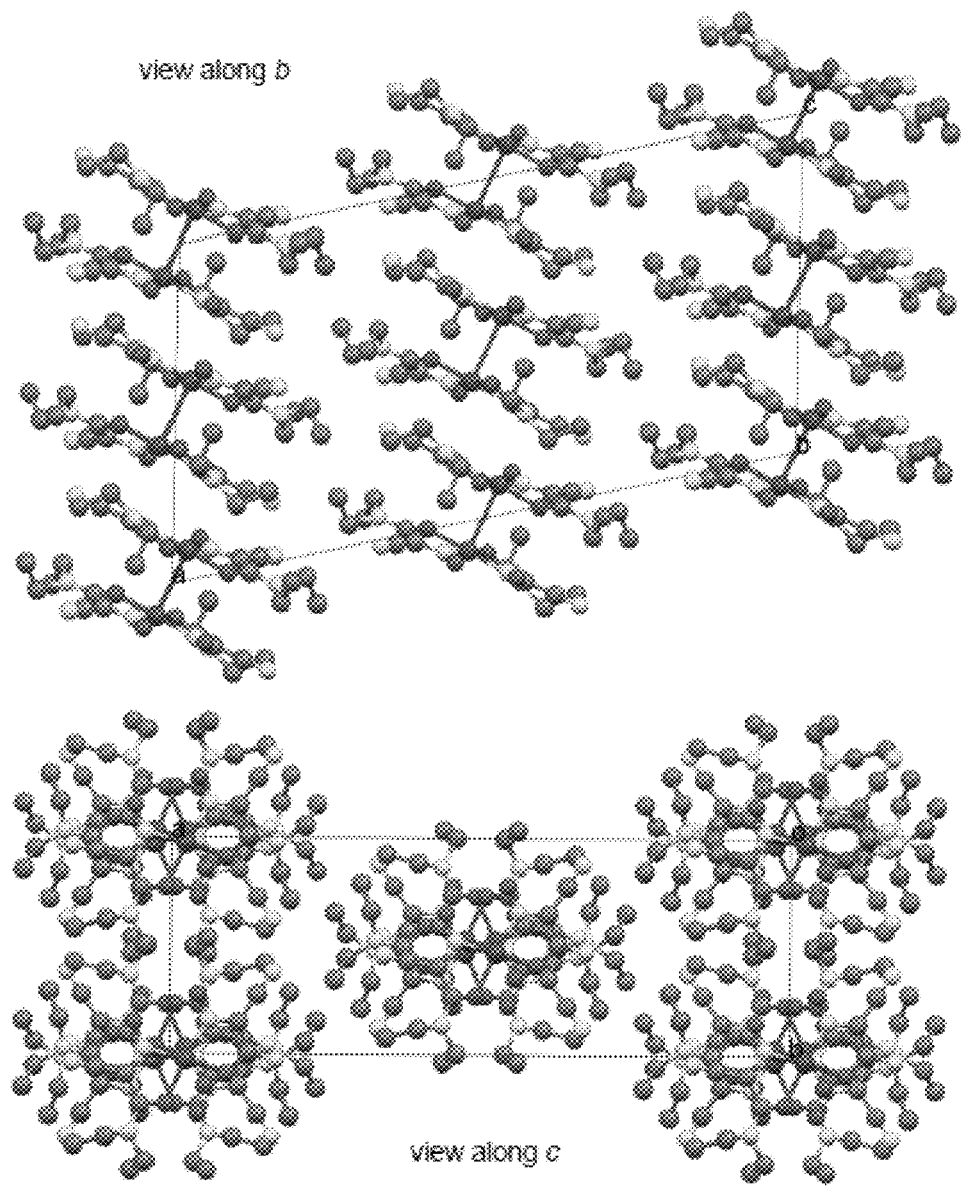
FIG. 24 shows perspective views of the unit cell content along different directions. H-atoms are omitted for clarity. Units of red Pt(DECO)$_2$ polymorph form slipped columns of dimers.
Figure 25:
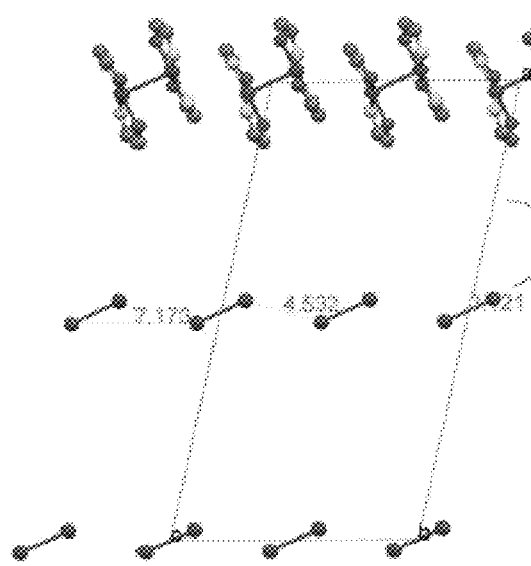
FIG. 25 (A) is a perspective view of 1.5 cells along b-direction showing only one layer of [PtN$_2$O$_2$] chelate rings and arrangements of Pt atoms in the structure with inter-platinum separations in one slipped column running along b.
Figure 25:
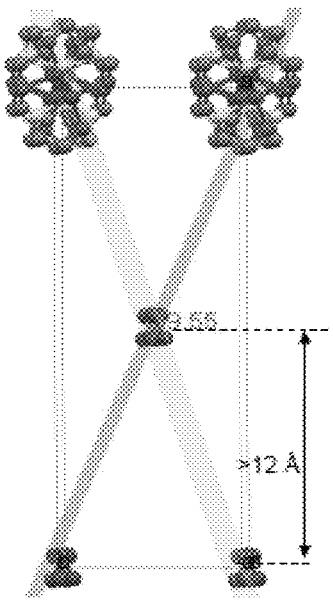
Figure 26:
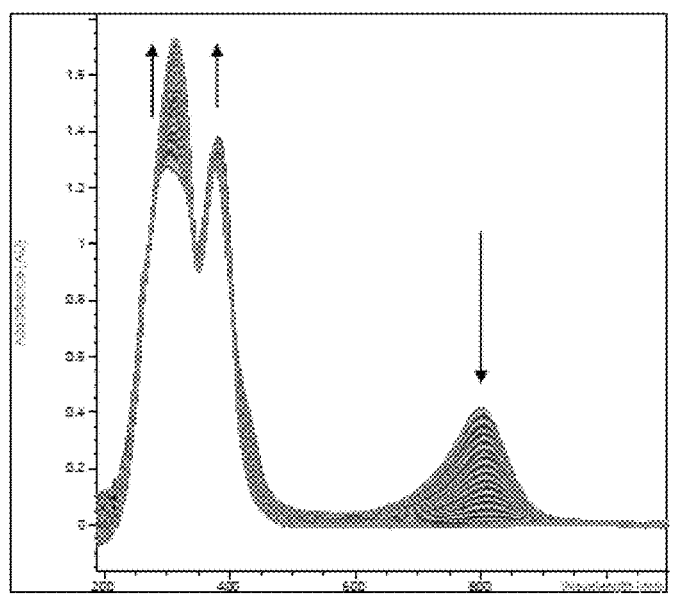
FIG. 26 is a graph illustrating time changes in UV-visible spectra of polymeric dark-green [Pt(DECO)$_2$]$_n$ upon addition of DMSO over 1 hour after addition of the donor solvent.
Figure 27:
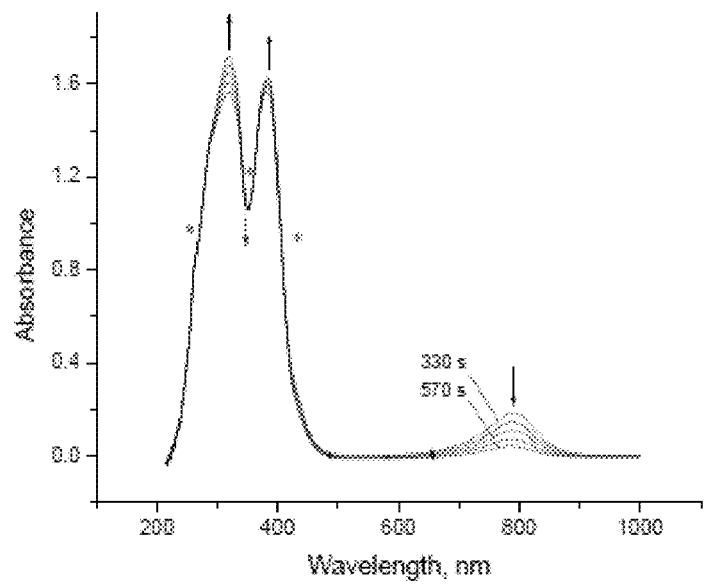
FIG. 27 is a graph illustrating time changes in UV-visible spectra of polymeric dark-green [Pt(DECO)$_2$]$_n$ upon addition of DMSO within the first 5-10 minutes showing quick decrease in 1D polymer content in the system.
Figure 28:
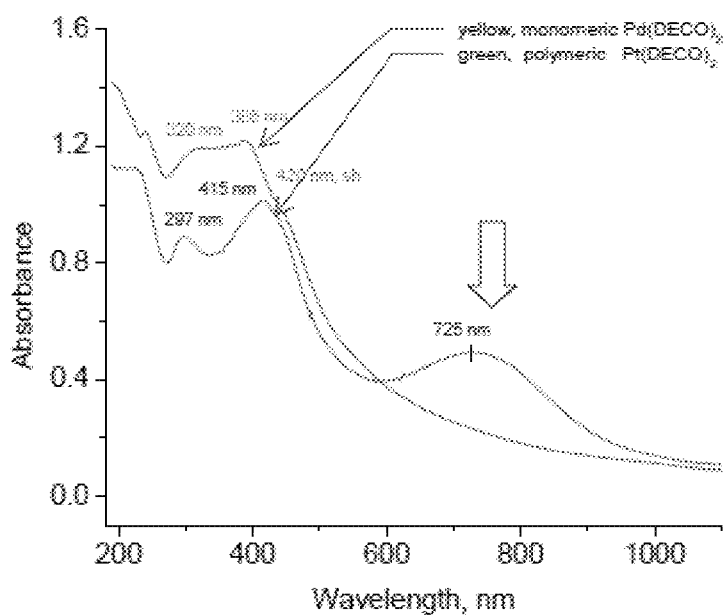
FIG. 28 is a graph showing solid state absorption spectra (recorded as fine suspensions in mineral oil) of 1D polymeric, dark-green [Pt(DECO)$_2$]$_n$ (5) and yellow monomeric Pd(DECO)$_2$ (6); T=+20° C. The numbers indicate maxima in both spectra, while an arrow shows wavelength (785 nm) used for the excitation during recording solid samples photoluminescence.
Figure 29:
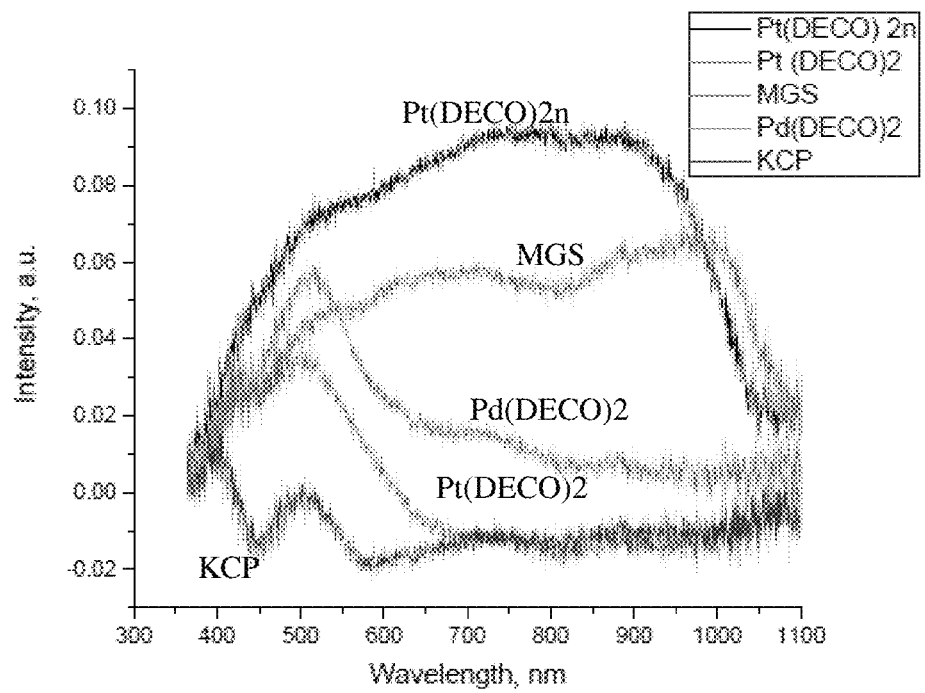
FIG. 29 is a graph illustrating solid state absorption spectra recorded in KBr tablets in an integrating sphere setup. The spectra is normalized to light intensity and referenced to the spectrum of pure KBr.

The overall structure is best described as columnar that consists of "slipped dimers" and is shown in FIG. 24, showing perspective views of the unit cell of complex 4 along different directions. The geometrical details are shown in FIG. 25; FIG. 25 (A) shows a perspective view of 1.5 cells along the b-direction showing only one layer of [PtN$_2$O$_2$] chelate rings and arrangements of Pt atoms in the structure with interplatinum separations in one slipped column running along the b direction. FIG. 25 (B) shows the same unit cell content view long the c-direction showing the tilt angle between two Pt—Pt distances in complex 4. The formation of red and yellow polymorphs of PtLX$_2$ (L=dipy, phen, bis-isoquinoline; X=Cl, Br, CN) is well documented in the past and recently for cyclometallated Pt-isonitriles. However, study of their inter-conversion has not been carried out. It is important to mention that other that Pt metals (Rh for example) in their complexes also exhibit yellow-to-red color changes when intermetallic distance get shorter in the 1D chain. That peculiar color change upon formation of aggregated structures with relatively short metallophilic contacts seems to be having rather general trend independent of metal center. The color changes to a dark-green (such as in MGS), or intense blue like in Pt, Rh and Ir blues when further decrease in intermetallic separation occurs.

Electronic Spectra of the Pt-Cyanoximates.

Data of UV-visible spectroscopy measurements for HDECO (1), its anion, DECO$^-$ (2, as NHEt$_3^+$ salt), and yellow monomeric Pd(DECO)$_2$ (6) and Pt(DECO)$_2$ (3) is shown in Table 6, below.

TABLE 6

UV-Vis spectroscopy measurements (summary)

| Compound | Solvent | C (mM) | $\lambda_{max}$ (nm) | $\epsilon$ (M$^{-1}$ · cm$^{-1}$) | Comment |
|---|---|---|---|---|---|
| | | Organic ligands: | | | |
| 1 | H$_2$O | n/a | n/a | n/a | insoluble in water |
| 2 | H$_2$O | 2.92 | 375 | 62 | n → π* |
| 1 | CH$_3$OH | 1.58 | 226 | 10330 | π → π* |
| 2 | CH$_3$OH | 1.58 | 394 | 73 | n → π* |
| 1 | C$_2$H$_5$OH | 1.52 | 228 | 9200 | π → π* |
| 2 | C$_2$H$_5$OH | 1.52 | ~387 | (shoulder) | n → π* |
| 1 | n-C$_3$H$_7$OH | 2.67 | 229 | 3625 | π → π* |
| 2 | n-C$_3$H$_7$OH | 2.67 | 285 | 3940 | π → π* |
| | | | 393 | 28 | n → π* |
| 2 | DMF | 1.53 | 472 | 47 | visible region only! UV not transparent |
| 2 | DMSO | 4.01 | 469 | 60 | visible region only! UV not transparent |
| | | Metal complexes: | | | |
| 6 | DMSO | 1.0 | 311 | 18120 | π → π* |
| | | | 368 | 16400 | π → π* |
| 3 | DMSO | 1.0 | 315 | 12900 | π → π* |
| | | | 381 | 9550 | π → π* |

Figure 30:
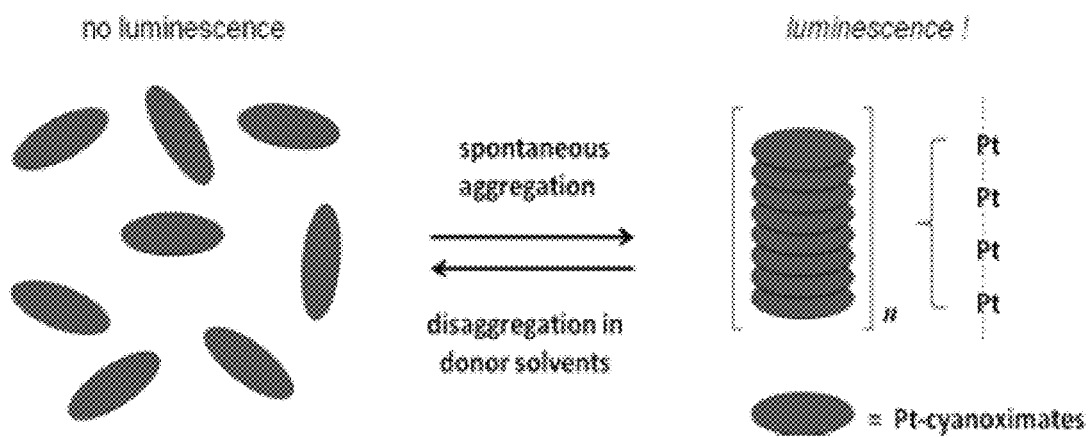
FIG. 30 shows the proposed structure of a dark-green 1D polymeric Pt-DECO complex 5 and its transformations in solutions.

The yellow monomeric complex 3 shows typical π→π* transitions in UV-visible spectra around 250-400 nm respectively (FIG. 14; Table 6). The red dimeric complex 4 has pronounced three bands in the UV-visible spectrum at 258 nm (ε=13,670), 374 nm (ε=18,500), and 542 nm (ε=4,400) with a weak shoulder at ~420 nm (FIG. 14). Uncommon dark-green color of the polymeric complex 5 deserves some careful consideration since the origin of such intense transition is not obvious. The color of this complex is comprised of a "blue" band at ~800 nm and a "yellow" band of tailing from UV-region of spectra of π→π* transitions at ~380 nm, and weak n→π* transition at ~420 nm, which is typical of all deprotonated cyanoximes. The presence of a broad band centered at ~800 nm in the absorption spectra of 5 in solutions (FIG. 14) and in solid state (FIGS. 26-29) immediately suggested the formation of a 1D coordination polymer observed in some other Pt complexes such as a well-known Magnus' Green Salt (MGS), [Pt(NH$_3$)$_4$] [PtCl$_4$]. The color of the MGS is attributed to the CT-band in "poker chip stacks" formed by alternating donor [PtCl$_4$]$_2^-$ and acceptor [Pt(NH3)$_4$]$_2^+$ units. These exhibit metallophilic interactions and are separated by 3.23 Å as compared to a typical covalent single Pt—Pt bond (2.6-2.8 Å in length). Similarly, in the absence of direct structural data, we propose the formation of 1D stacks for the "green" Pt(DECO)$_2$ complex 5 in which short (~3.1 A) metallophilic Pt---Pt contacts are present. The green color of the complex 5 quickly disappears upon its dissolution in donor solvents such as DMSO, DMF, CH$_3$CN, pyridine and picolines, which evidenced loss of 1D polymeric structure in these solvents. Yellow solutions formed have UV-visible spectra identical to those for monomeric complex 3. However, the DMF, CH$_3$CN solutions upon drying regenerate green solid 5 (often contaminated with red polymorph 4), which suggests the transformation shown in Scheme 1 and FIG. 30, showing the proposed structure of a dark-green 1D polymeric Pt-DECO complex, 5, and its transformations in solutions. Thus, the red dimer 4 is an intermediate product of such aggregation/disaggregation processes and, acts as a building block with observed short Pt---Pt interactions necessary for the formation of the green 1D polymer 5. It should be noted that the formation of dark-green, or blue-green aggregates of other Pt-based alkynyl and terpyridyl complexes in solutions has been previously observed and correlated with the leading role of metallophilic interactions.

Figure 31:
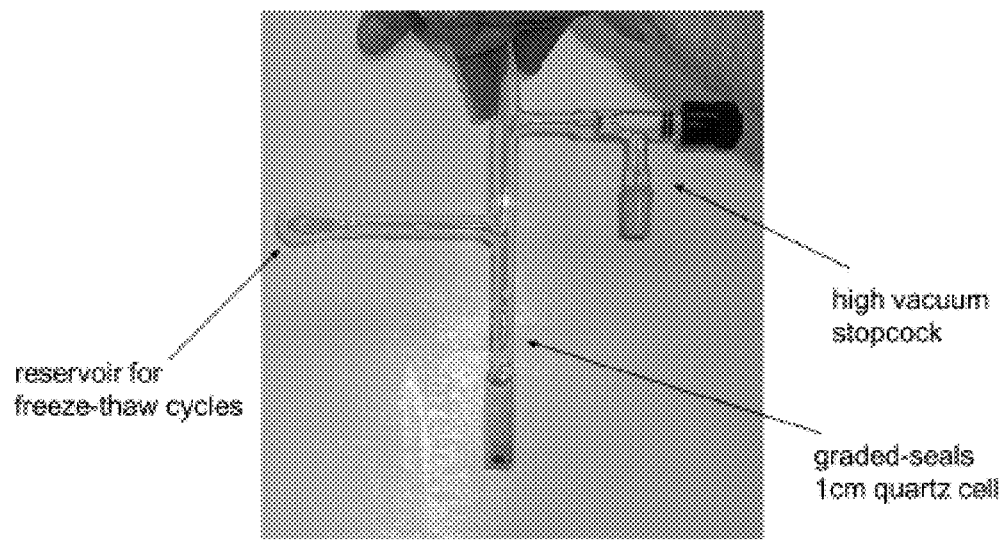
FIG. 31 illustrates a custom made 1 cm quartz cuvette.

One plausible explanations for the origin of such intense broad band in the NIR region of spectra for the polymeric complex 5 both in solid state and in solutions in which compound is stable may be the formation of mixed valence coordination polymer that contains small amount of non-stoichiometric Pt(IV) species. Thus formation of a "solid solution" of [Pt(DECO)$_2$]$_n$ (5) containing metal centers other than Pt(II) may be preferable. In this case a small amount of higher oxidation state platinum may provide conditions for appearance of low energy IVCT band between Pt(II)/Pt(IV) or Pt(II)/Pt(III) centers. This scenario was well documented during extensive investigations of "platinum blues" and related compounds in the past. Air oxygen or chemical oxidizers such as H$_2$O$_2$, Fe(III) or Ag(I) cations were successfully employed in the past for generation mixed valence complexes that had intense colors, and also demonstrate anisotropic properties in solid state, with electrical conductivity being one of them. The issue of partial air-oxidation of the initial Pt(DECO)$_2$ complex may be addressed by carrying out its preparation at strictly anaerobic conditions using specially designed 1 cm quartz cuvette that allows de-aeration of starting solutions via repeated freeze/thaw cycles accompanied with the system flash with argon. The cuvette may be filled with argon at room temperature and the components, K$_2$[PtCl$_4$] and K(DECO) may be mixed together by tilting the cuvette. A miniature stir bar at the bottom of the cuvette allows thorough mixing of the solution during the reaction. The cuvette is shown in FIG. 31.

Figure 32:
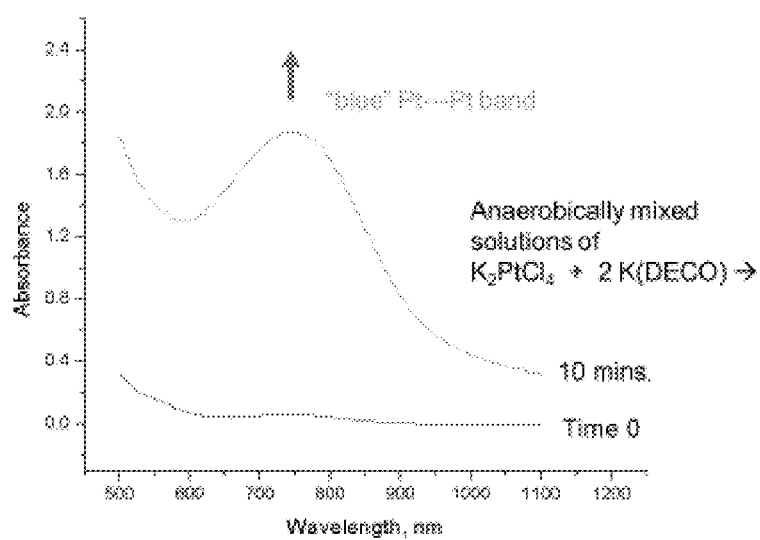
FIG. 32 is a graph showing the absorbance spectrum of [Pt(DECO)$_2$]$_n$.

The presence of O$_2$ does not seem to be the sole source of the Pt(II) oxidation because "blue band" started to grow after ~10 min followed anaerobic mixing of components (see FIG. 32). There is, however, a possibility for chemical oxidation of Pt(II) by the cyanoxime. The following illustrates the relationship between different classes of NO/NH containing compounds:

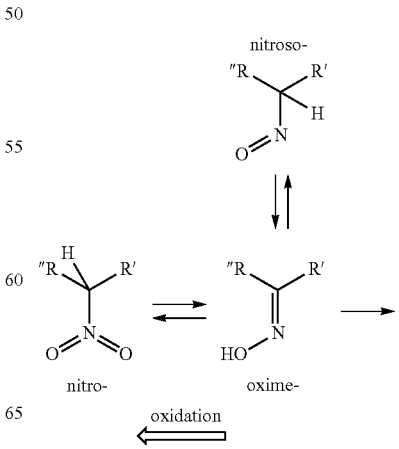

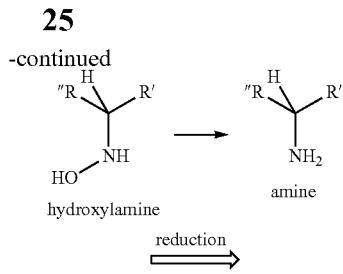

hydroxylamine reduction amine

The oxidation of oximes/nitroso compounds was known to be successfully carried out using $KMnO_4$ or $K_2S_2O_8$ by H. Köhler. The reduction of oximes/nitroso compounds to amines using $Na_2S$ or Zn chunks was discovered by N. N. Zinin and is widely used in syntheses of anilines.

Figure 33:
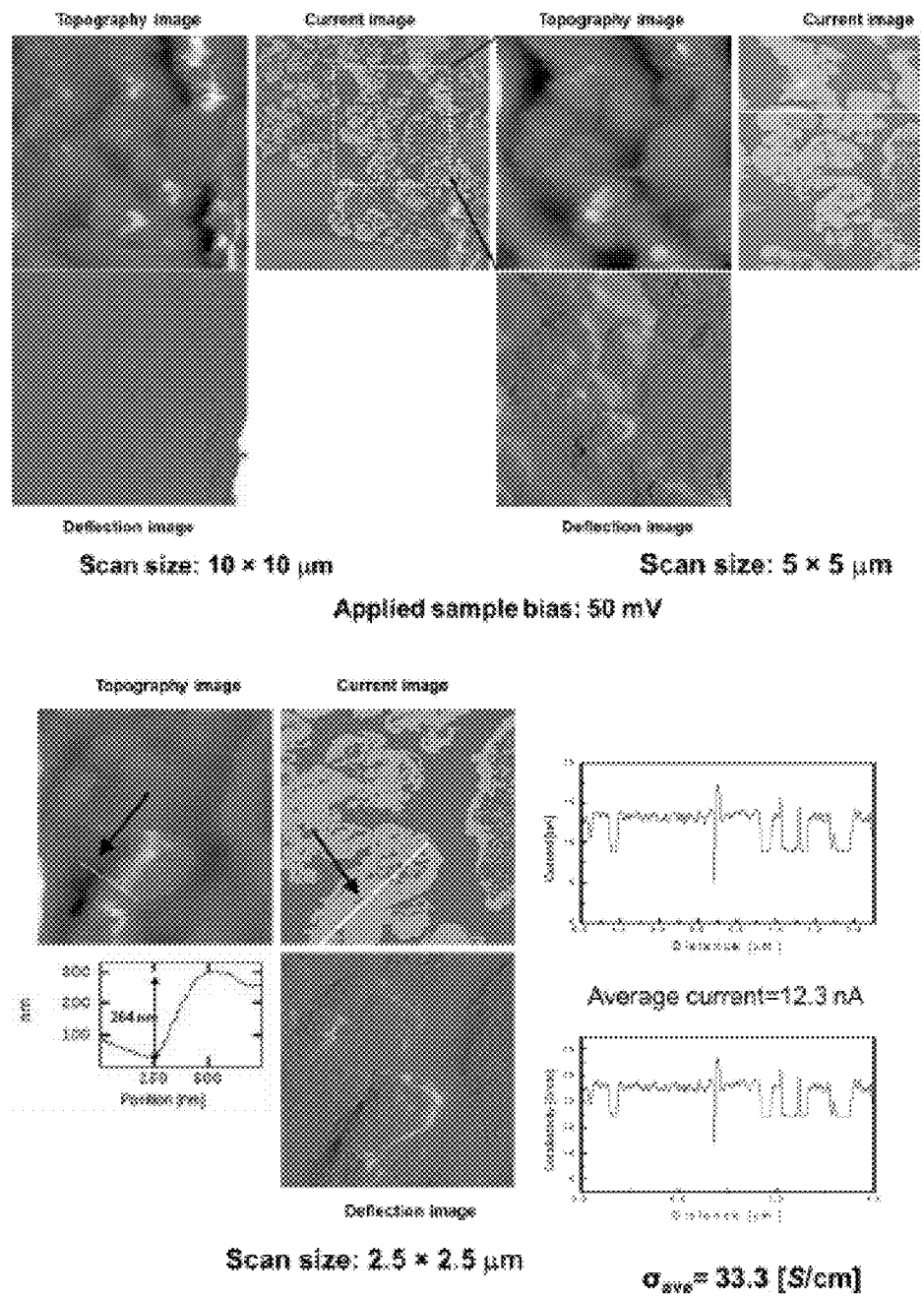
FIG. 33 illustrates scanning electron microscopy images and solid state electrical conductivity of dark-green polymeric [Pt(MCO)$_2$]$_n$ complex at different scan sizes showing details of its electrical conductivity measurements.
Figure 34:
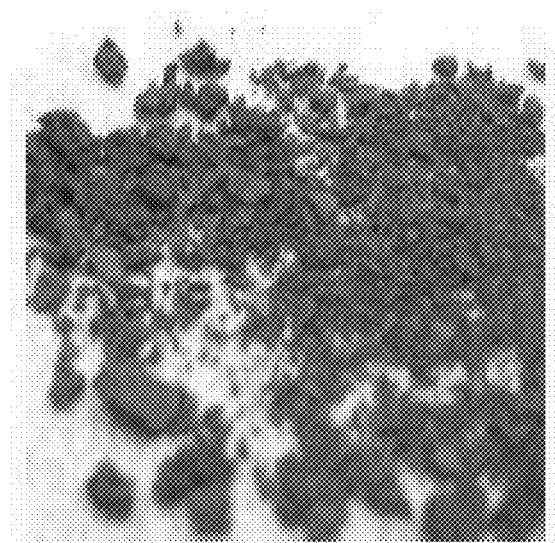
FIG. 34 is an actual optical microscope photograph of the compound at 40× magnification.
Figure 35:
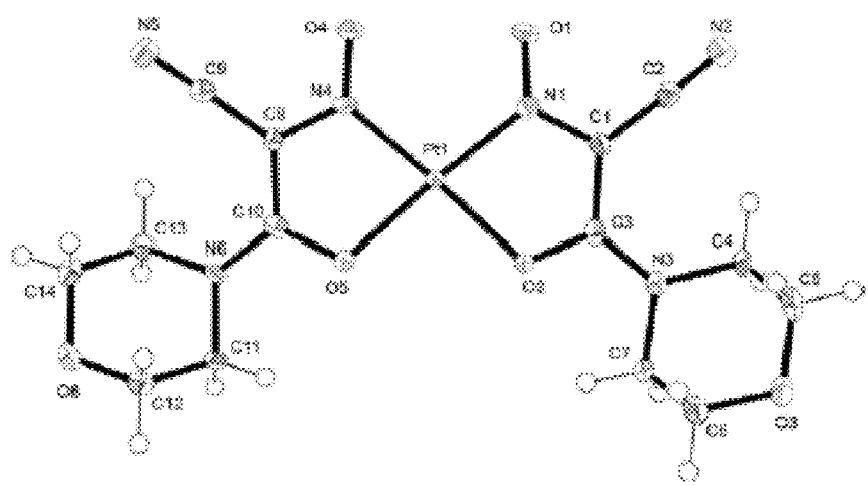
FIG. 35 shows the crystal structure of the yellow monomeric Pt(MCO)$_2$ complex.

Thus, a partial reduction of the ligand in aqueous environment to hydroxylamine with the formation of a small amount of Pt(IV) may lead to the formation of a mixed valence complex, which self-aggregates using Pt---Pt interactions into 1D polymer 5. The latter shows intense bands in the visible region and emits in the NIR region of spectrum (FIG. 14). Interestingly enough, similar to complex 5 described herein, other solid dark-green $Pt(PiPCO)_2$ $Pt(MCO)_2$ complexes conduct electricity in the upper range for semiconductors showing values of solid state conductivity at room temperature as 22 and 33 S/cm respectively. Data for the $[Pt(MCO)_2]$ complex at different scan sizes showing details of its electrical conductivity measurements is shown in FIG. 33. An actual optical microscopic photograph of the compound at 40× magnification is shown in FIG. 34. Finally, FIG. 35 shows the crystal structure of yellow monomeric $Pt(MCO)_2$.

Observed electrical conductivity for $Pt(PiPCO)_2$ and $Pt(MCO)_2$ complexes at the high end of semiconductors indicates presence of delocalized carriers at room temperature, which is typical of mixed valence compounds. Such carries, for example, were introduced in solid state solution of famous Magnus Green Salt upon partial oxidation of Pt(II) and mixed valence species dramatically improved its conductivity. Mentioned above dark-green polymeric $Pt(PiPCO)_2$ and $Pt(MCO)_2$ complexes being excited at 770 nm also emit in the NIR region at 1020 nm and 1038 nm respectively. These new cyanoxime ligands also represent N-acetamides formed with piperidine and morpholine respectively.

Figure 36:
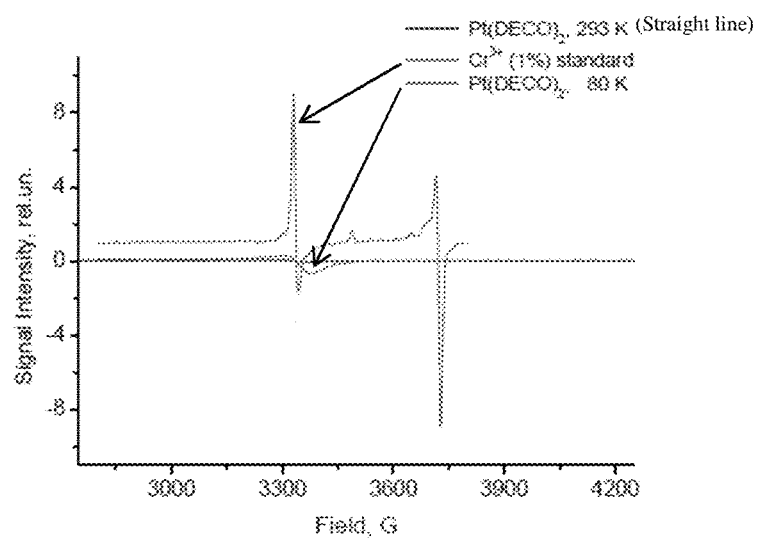
FIG. 36 is a graph showing the EPR spectra of solid samples of 1D polymer 5.

FIG. 36 illustrates EPR spectra of powdery samples of studied $[Pt(DECO)_2]_n$, 5, at 293 and 80 K and sensitivity standard containing 1% of Cr(III) in $Al_2(SO_4)_3$. The formation of Pt(III) species as impurities in dark-green complex 5 is excluded based on the EPR-silence of this coordination polymer at 293 and 80 K. The Pd(III) centers have readily observable low-spin d7 configuration in a square-planar environment.

The formation of a variable length aggregates in 5, that are held together by metallophillic Pt---Pt interactions, can provide an explanation for some range of $\lambda_{max}$ of the "blue band" at ~720-820 nm in visible/NIR spectra attributed to "poker chip" stacks of a variable size. Thus, a difference between values of maxima in spectra of 5 in solid state and different solvents, including micelles, can be as big as ~100 nm. However, donor solvents such as DMSO and Py facilitate fast and monotonic decrease of the "blue band" intensity and its eventual disappearance (FIGS. 26-27) with remaining spectrum identical to that of a yellow complex 3. It is important to note similar behavior of mixed valence tetrameric Pt-blue complex $[Pt_4(NH_3)_8(DMGI)_4].(NO_3)_5.2H_2O$ (DMGI=3,3-dimethyl-glutaimidate) where an intense band at ~750 nm decreases upon complex disaggregation and reduction to bivalent species.

The red dimer 4 has a pronounced band at 542 nm (FIG. 14). The latter may be attributed to the MLCT band as was observed for several red Pt(II) dimers of $[PtLX_2]$ (L=dipy, phen; X=Cl, Br, CN) composition in the past. The phenomenon of a size-dependent change of $\lambda_{max}$ in the PL of quantum dots, wells and nanoparticles is well established, and also associated with extensive charge carriers delocalization.

It may be likely that both outlined above cases take place in our particular example of polymeric 1D Pt-cyanoximates where mixed valence species with IVCT have dominant effect. In that sense, the presence of a small quantities of Pt(IV) centers in the complex 5 is similar to a doping effect well known and widely used for semiconductors. In our case, however, it is manifested by a significant red shift of the emission into the extended NIR region beyond 1000 nm.

Photoluminescence of Solid Complexes in the NIR Region.

Figure 37:
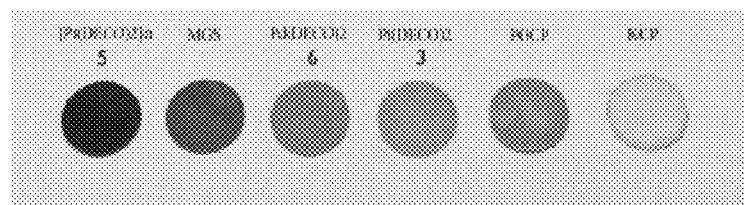
FIG. 37 is a photograph showing KBr pellets containing studied metallo-cyanoximates and model complexes.

Crystal data for complexes 3, 4 and 6 revealed that Pd, Pt cyanoximates are typical Werner-type complexes of Ni-triade. Many complexes of this family are known to form dimers, or extended 1D columnar structures that exhibit strong anisotropy of their physical and optical properties. For instance, they possess electrical conductivity and demonstrate unusual recently detected photoemission in the red part of the visible spectrum. The presence of an NIR absorption band associated with metallophilic interactions in the UV-Vis spectra of 5 prompted us to investigate the photoluminescence of this compound in the NIR range. To avoid the observed interconversion of the species 3⇌5 in solution, we investigated the emission in the solid state. The solids were embedded in the KBr matrix at 5% by weight concentration to minimize the uncertainties associated with powder density and particle size, and enhance the reproducibility of the results. Such a technique is commonly used in FTIR measurements but was originally also proposed for absorption spectra. Control compounds, such as model 1D Pt salts with a known different Pt---Pt distance (FIG. 37), as well as $Pd(DECO)_2$ complex 6 (FIG. 15), were also investigated. The pellets shown in FIG. 37 had long shelf-life stability (more than a year) if stored in a desiccator at room temperature.

Figure 38:
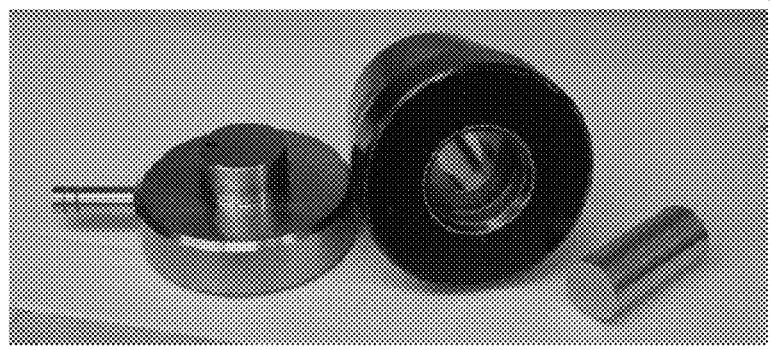
FIG. 38 is a photograph of a 3 mm die/anvil hardened steel set used for pressing KBr pellets containing 5% (by weight) of studied compounds.
Figure 39:
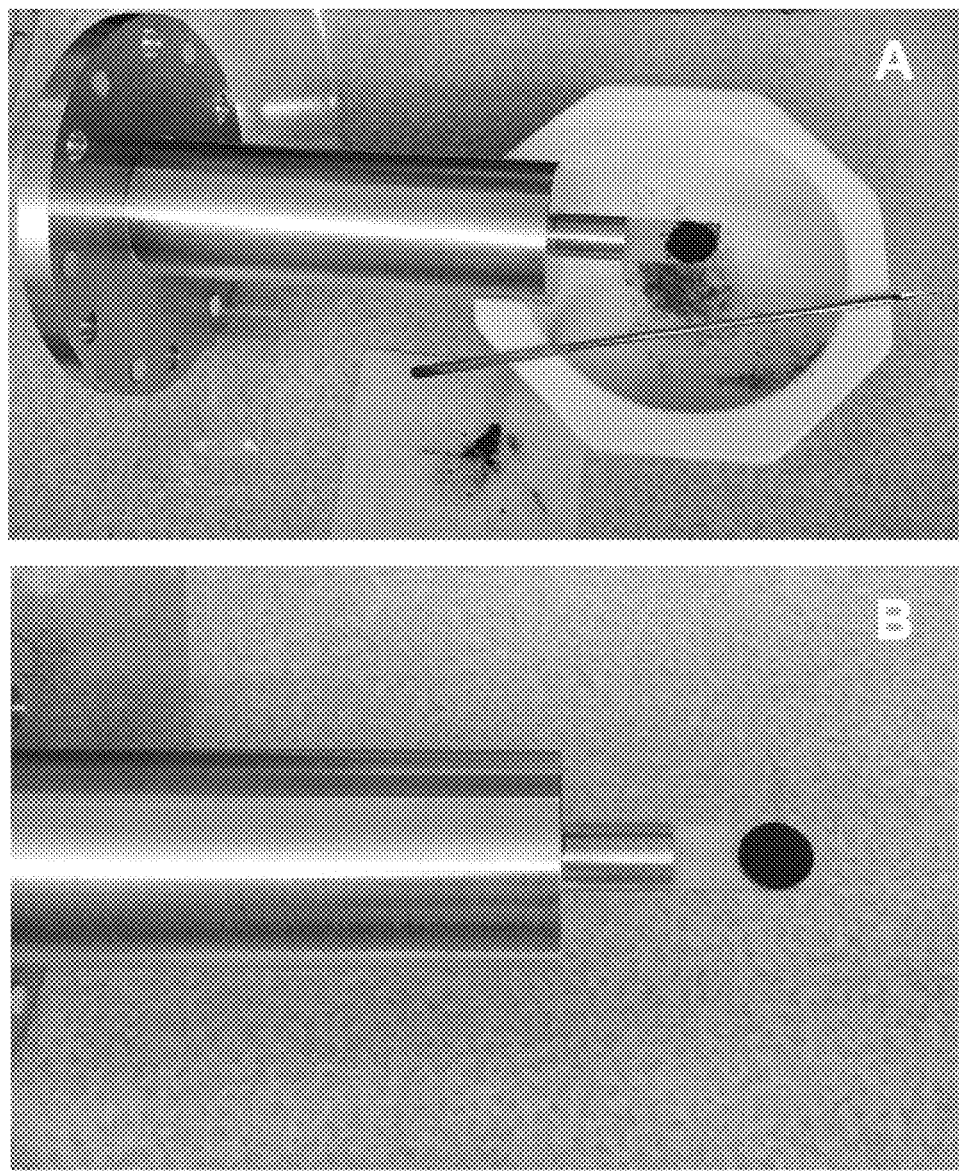
FIG. 39 (A) illustrates the handling of samples for variable temperature photoluminescence measurements. The photograph shows the attachment of a fine powder to the surface of cold finger covered with double-sided ½" Scotch tape.

The pellets were prepared using a 13 mm die/anvil hardened steel set (FIG. 38). Samples of 1D polymeric $[Pt(DECO)_2]_n$, 5, for solid state photoluminescence measurements were attached to the surface of a cold finger covered with double-sided Scotch tape, as shown in FIG. 39 (A),(B).

Figure 40:
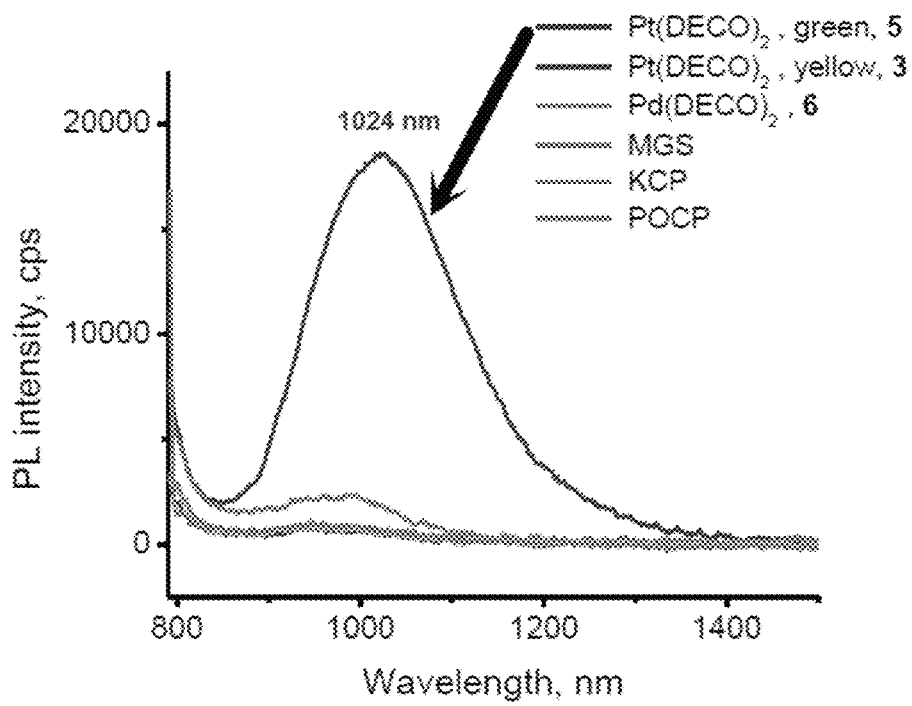
FIG. 40 is a graph illustrating the emission of Pt— and Pd-DECO complexes embedded in KBr pellets (5 w. %); $\lambda_{ex}$=770 nm; detector was a liquid N$_2$ cooled CCD camera.
Figure 41:
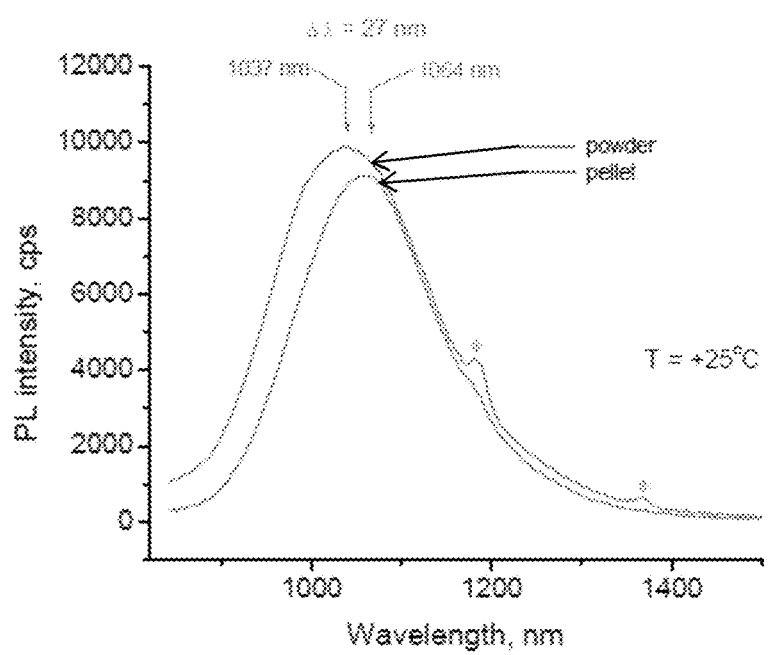
FIG. 41 is a graph illustrating the photoluminescence of 1D polymeric, dark-green [Pt(DECO)$_2$]$_n$ (5) from pure powder and from the pellet in KBr (5% by weight).
Figure 42:
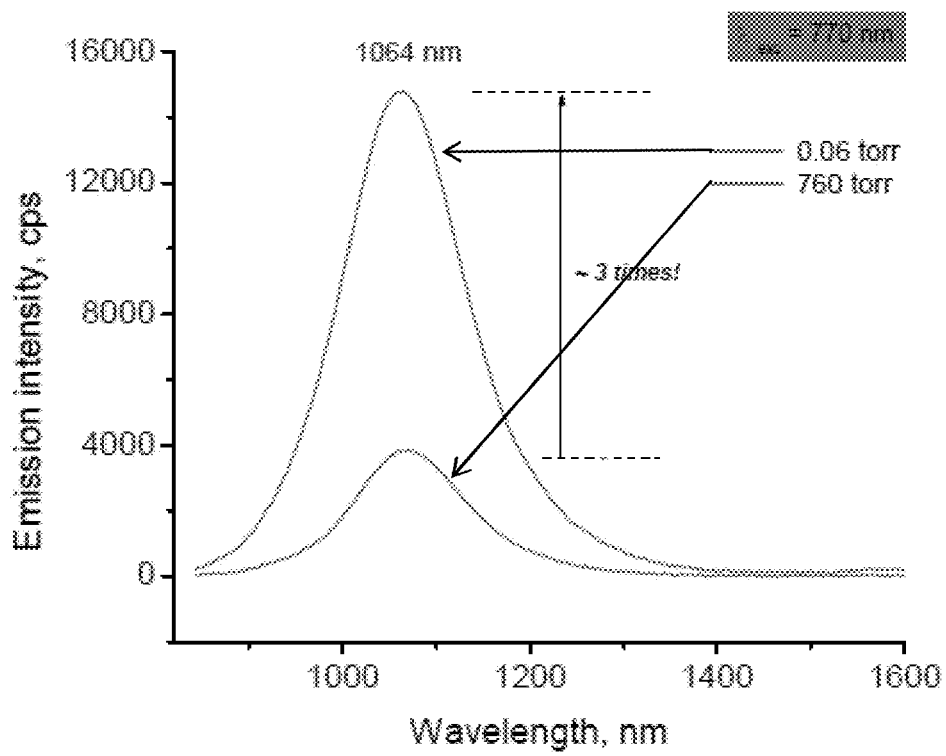
FIG. 42 is a graph illustrating the emission spectra of [Pt(DECO)$_2$]$_n$ dark-green sample, 5, as 5% pellet in KBr, in vacuum and on air.

All pellets were excited at 770 nm with emission measured in the range of 800-1600 nm. Among the studied complexes, only the dark-green Pt-complex 5 was found to emit in the NIR range with $\lambda_{max}$~1060 nm (FIG. 40). The effect of the KBr matrix was marginal; the powder also exhibited a similar NIR emission although at a slightly shorter emission maximum (1047 nm; FIG. 41). Also, it was found that in vacuum the intensity of the NIR emission is much higher, which implies the role of air oxygen in the triplet state as the phosphorescence quencher (FIG. 42). Quantum yield of the emission from a solid pellet of 5 in KBr was measured absolutely and was found to be 0.5% (FIG. 42). Although this quantum yield appears to be low, it might be significantly higher in the tablets with lower concentration of the active component. The graphs shown in FIG. 29 demonstrate significant absorption from the tablet, thus pointing to potential re-absorption by the sample that leads to lowering the measured quantum yield especially with the absolute method.

The Pt monomeric and dimeric complexes 3 and 4 were not emissive in the NIR region in accordance with the absence of the absorption band at the wavelength of excitation (770 nm). Similarly, known 1D Pt-coordination polymers such as MGS, POCP, KCP (FIGS. 37, 40), that were used as control compounds, did not show any measureable photoluminescence in the NIR region of the spectrum being excited at 500-770 nm range. This demonstrates the critical importance of the cyanoxime DECO⁻ ligand 2 in the complex perhaps due to its ability to alter electronic structure of the polymer 5 in a way of dramatic lowering of energy of key molecular orbitals corresponding for transitions. Also, an electron-withdrawing character of the cyanoxime can make the formation of mixed valence species easier and thus facilitate electron "hopping" between two different oxidation states.

Figure 43:
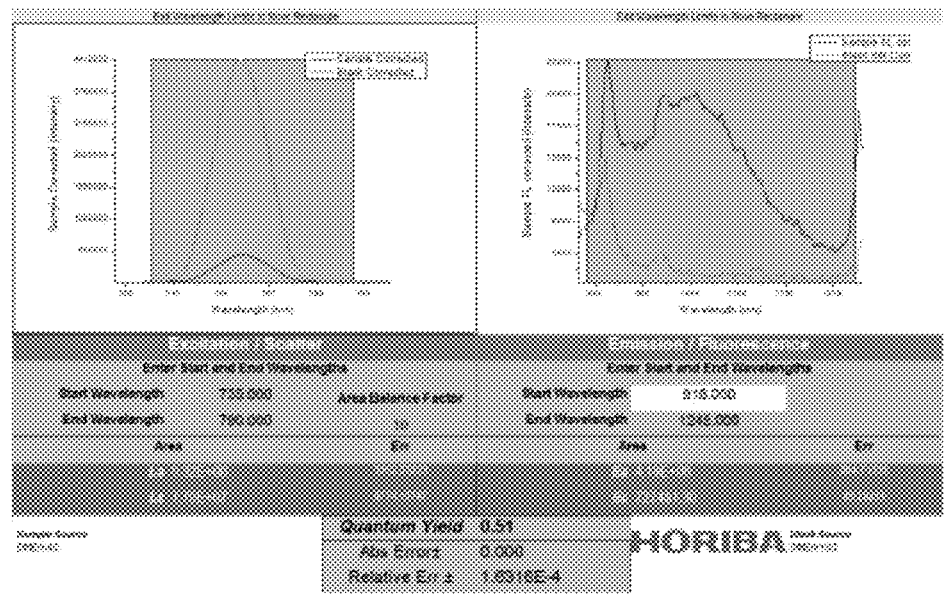
FIG. 43 shows an assessment of the quantum yield (QY) of the photoemission from KBr pellet with dark-green 1D polymeric Pt-cyanoxime 5 (at 5 weight % concentration) using absolute total reflectance from the sample.
Figure 44:
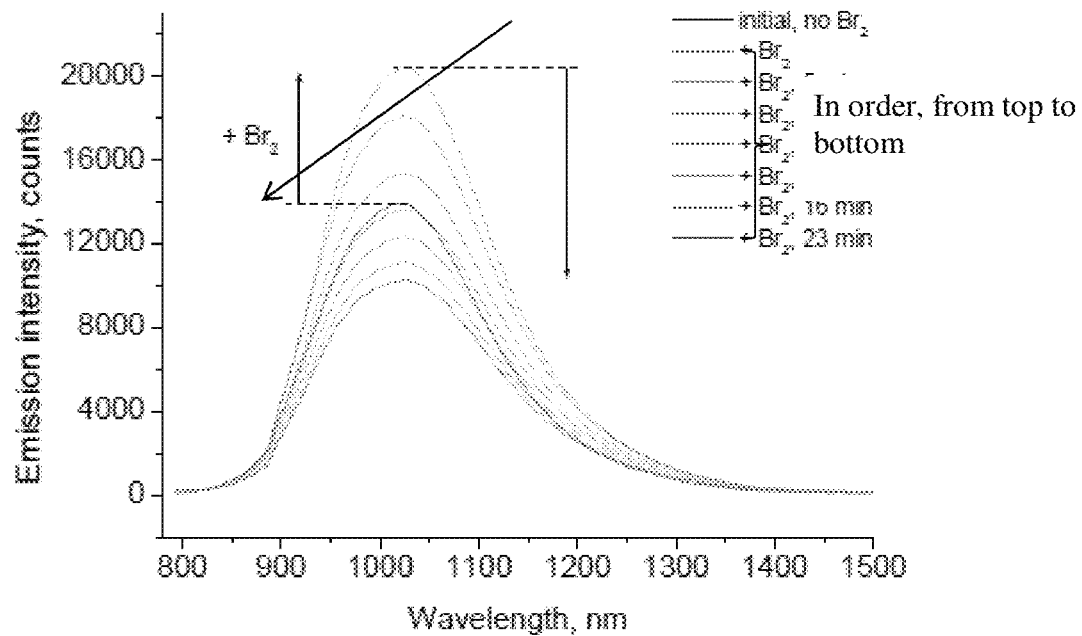
FIG. 44 is a graph illustrating oxidation of 1D-polymeric complex (5) with elemental Br$_2$.
Figure 45:
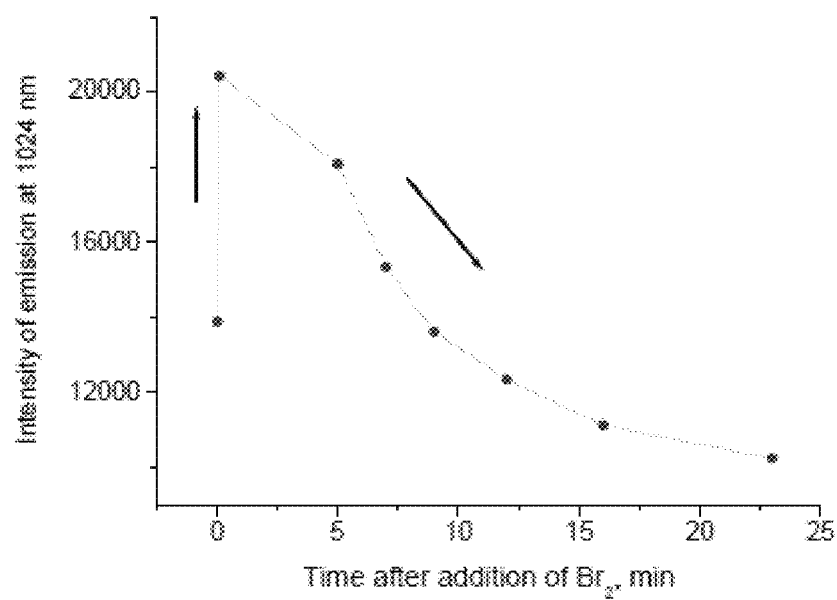
FIG. 45 is a graph showing the emission intensity of 1D-polymeric complex (5) over time after the addition of elemental Br$_2$.

The observed photoluminescence of 5 may originate from low-energy transitions in extended mixed valence complex with metallophilic interactions between centers. In order to prove it, a small drop of $Br_2$ was added into the chamber with the KBr pellet containing 5. The intensity of the emission in the first minute of such treatment has increased by ~30% with the pellet changing color from dark-green to copper-red, following by slow decrease in the NIR emission and pellet turning yellow (FIG. 43). Thus, bromine partially oxidized Pt(II) to Pt(IV) and facilitated significant increase in the degree of formation of mixed valence complex. The decrease in intensity is associated with the complex decomposition in the presence of halogen (FIG. 44).

Figure 46:
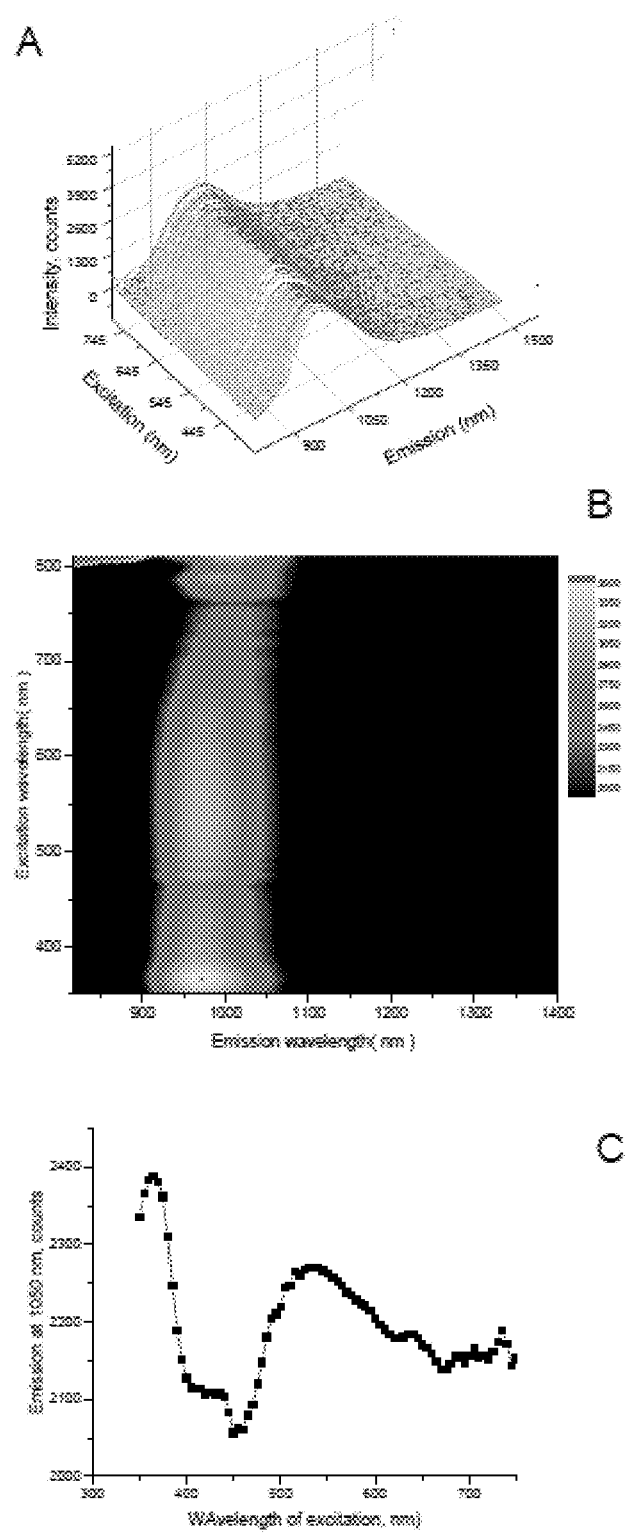
FIG. 46 is a 3D excitation-emission scan of green 1D polymeric [Pt(DECO)$_2$]$_n$ in KBr tablet (A), its 2D projection (B) showing the position of the emission at 900-1100 nm practically independent on the excitation wavelength (the intensity was corrected for the light intensity), and the excitation spectrum (C) recorded in the range 350-810 nm.

Under the same synthetic conditions as for Pt-DECO complexes, $Pd(DECO)_2$ forms exclusively a yellow monomer 6 (FIG. 15, Table 4) that has no NIR emission. Importantly, there are some significant differences in time between the Pt and Pd complexes' formation. For instance, the $Pd(DECO)_2$ complex 6 formed within several minutes, as opposed to the much slower reaction of the formation of the green $Pt(DECO)_2$ complex 5. This is in line with the much greater kinetic lability of bivalent palladium as opposed to platinum. Hence, kinetic lability may explain why the Pd(II) complexes did not form the extended 1D polymers necessary for emission in the NIR region. The emission-excitation scan for the KBr pellet of 5 is shown in FIG. 46A, B evidenced that the position and intensity of the emission signal remains around 1000 nm and weakly dependent on the excitation wavelength. This is typical of systems with delocalized charge carriers such as mixed valence species, quantum dots and wells. The emission spectrum of 5 was registered at the range of 825-1400 nm using step 5 nm and integration time 0.5 s with the help of CCD diode array detector. Moreover, the emission scan does not resemble the absorption spectra of the green $[Pt(DECO)_2]_n$ complex 5 in KBr pellets (FIG. 29), because of severe distortion of the former due to strong chromophores coupling in the solid state.

Dependence of the Emission Profile from Temperature

Figure 47:
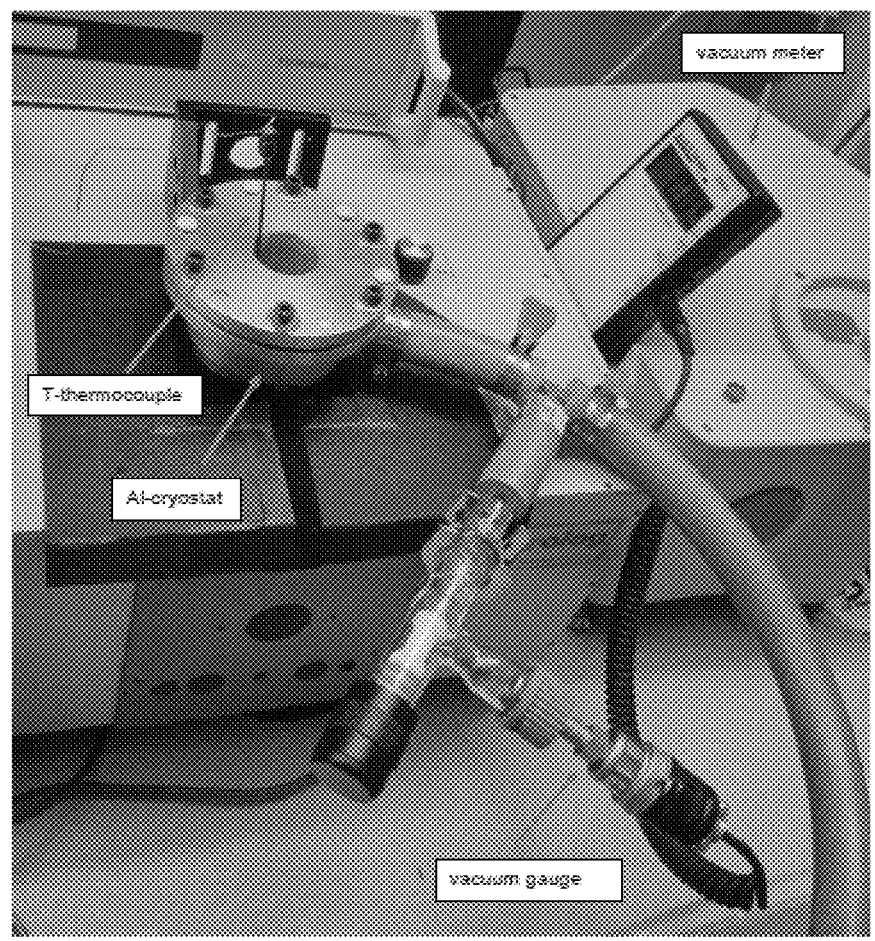
FIG. 47 is a photograph of a custom made liquid N$_2$ or hot water/oil filled cryostat for the PL measurements of solid samples of synthesized compounds.
Figure 48:
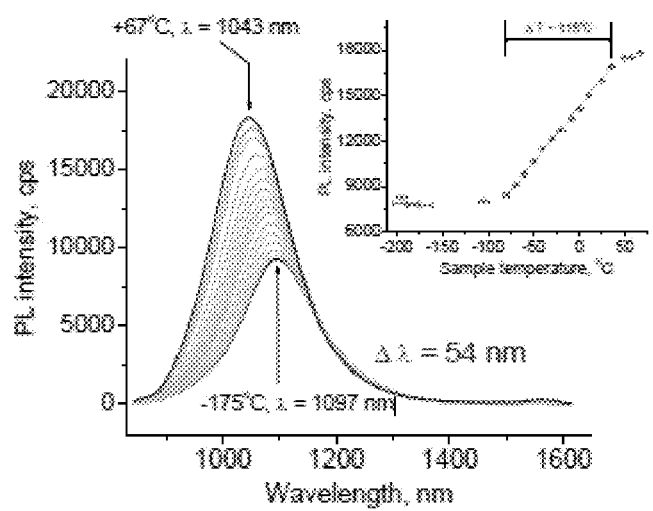
FIG. 48 is a graph illustrating the temperature dependence of emission of green Pt complex 5 embedded in KBr pellets (5 weigh %), $\lambda_{ex}$=770 nm; monitored at 1061 nm. An inset shows a large linear response in the emission intensity change with temperature

Transitions Energy and Line Intensity:

Investigation of the temperature-dependent photoluminescence of the dark-green complex 5 in the KBr pellet shed some light on the mechanism of the emission. The experiments were carried out using a custom-built liquids-filled cryostat (FIG. 47) with the sample under vacuum ~6·10⁻² torr to prevent moisture condensation on the quartz windows. Data displayed in FIG. 48 indicates a pronounced bathochromic shift of the $\lambda_{max}$ of the emission band and a significant intensity decrease upon the temperature lowering from +50° C. to −170° C. Surprisingly, the observed signal intensity change for complex 5 is opposite to the common trend. However, a very similar red shift of the emission energy was found earlier for other quasi one-dimensional solids such as numerous KCP-type compounds and columnar red polymorphs of $PtLX2$ (L=dipy, phen; X=Cl, Br, CN), or non-aggregated [Pt(ter)Y] (ter=terpyrinine; Y=Cl, or solvent molecule).

The yellow monomeric complex 3 and red dimer complex 4 are not emissive; only complex 5, which may be assembled into a 1D polymer, shows pronounced luminescence beyond 1000 nm. The simultaneous increase in emission intensity with temperature may be explained by analogy with the well-documented behavior of quantum dots and quantum wells with delocalized carriers. Thus, multi-core and multi-shell CdSe/CdS/ZnS/ZnSe quantum dots, as well as single quantum wells GaAsSb/AlGaAs, demonstrate very similar temperature induced changes in the emission energies and intensity profiles. Consequently, excitons with a temperature increase gain sufficient thermal energy to overcome small potential barriers in the local potential minimum, become mobile, and transfer to higher energy states of the band until reaching the edge of the conduction band. Hence, the emission energy undergoes a blue shift with the temperature increase.

It may be understood that at low temperatures, excitons mostly localize in a mixed valence aggregate which is small in size, or even in the mixed valence dimer. Elevation of the temperature creates delocalized excitons that can now reach higher energy states and, due to electron hopping, spread on a larger distance, increasing the probability of emission from a larger number of mixed valence centers along the Pt---Pt wire. In general, increasing with temperature electronic hopping interactions between sites leads to a greater degree of delocalization in both ground and excited states. The energy that corresponds to observed shift of 54 nm is 472 cm⁻¹ (58 meV, or 5.65 kJ/mol) for the complex 5 (FIG. 47) is consistent with the delocalization of electrons along the 1D chain in compounds with metallophillic interactions. Ultimately, these results can be explained in terms of the increase of the distance traveled by electrons along the 1D Pt---Pt chain (e-delocalization) with the rising temperature, which re-quires higher energy. Lower temperatures tend to localize this motion to a smaller distance. Similar blue-shift behavior was reported for a series of Cd-halcogenide and In—As quantum dots and wells where even values of the PL temperature shifts are in the same range of 30-60 meV.

The intermetallic Pt---Pt distances in KCP, MGS, and POCP were previously reported as 3.5 Å, 3.25 Å, and 2.89 Å respectively. The crystal structure of the dimer 4 showed the Pt---Pt distance as 3.1208 Å and apparently the emitting 1D polymeric complex 5 has the same or similar intermetallic distance. The data indicates rather clearly that the length of the metal-metal bond alone cannot explain the observed emission. Rather, the combination of several factors is important. The unique role of the cyanoxime ligand in the emission is suggested to be critical to: (1) form an appropriate low energy electronic states including metal orbitals due to asymmetric cis-$PtN_2O_2$ environment with significant covalent character in Pt—N bonding, (2) electron-withdrawing character of the ligand which allows depletion of electron density from metal centers and helps in formation of mixed valence centers due to intramolecular redox process, and (3) and provide favorable geometrical configuration leading to alignment of 1D polymeric "poker chip stacks" of the certain length and necessary for the NIR emission.

Figure 49:
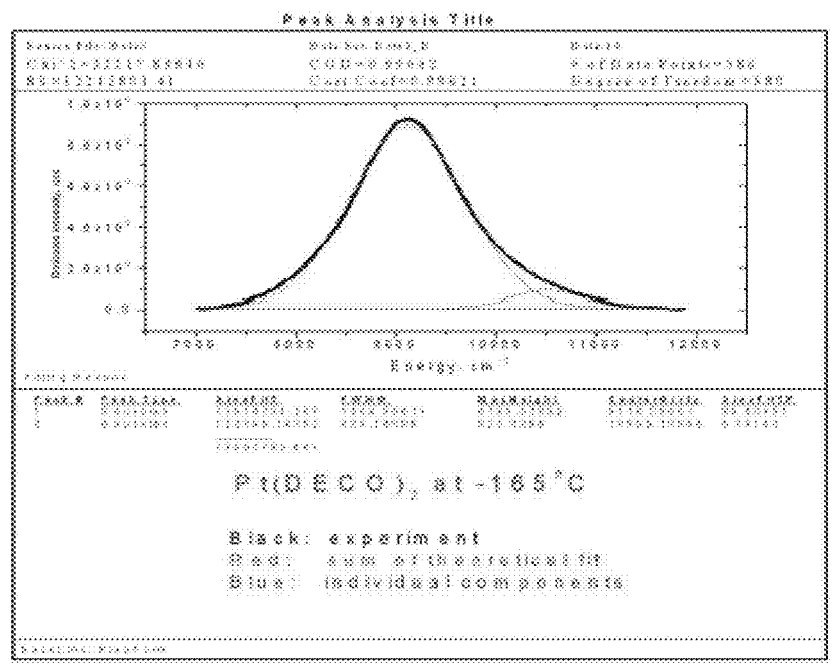
FIG. 49 is a graph illustrating the emission line shape analysis for solid sample of complex 5(in KBr pellet; at 5% concentration) at −165° C.
Figure 50:
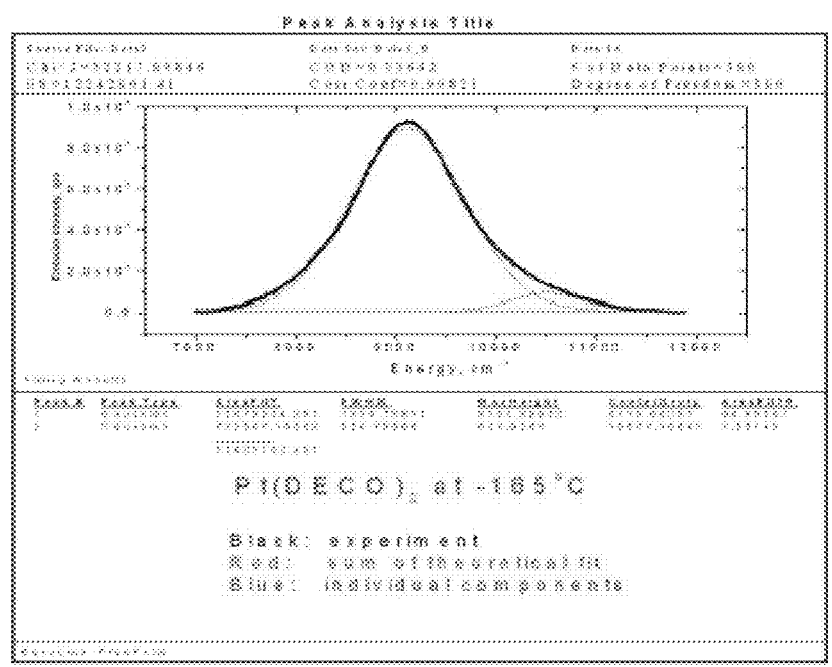
FIG. 50 is a graph illustrating the emission line shape analysis for complex 5 at +50° C.
Figure 51:
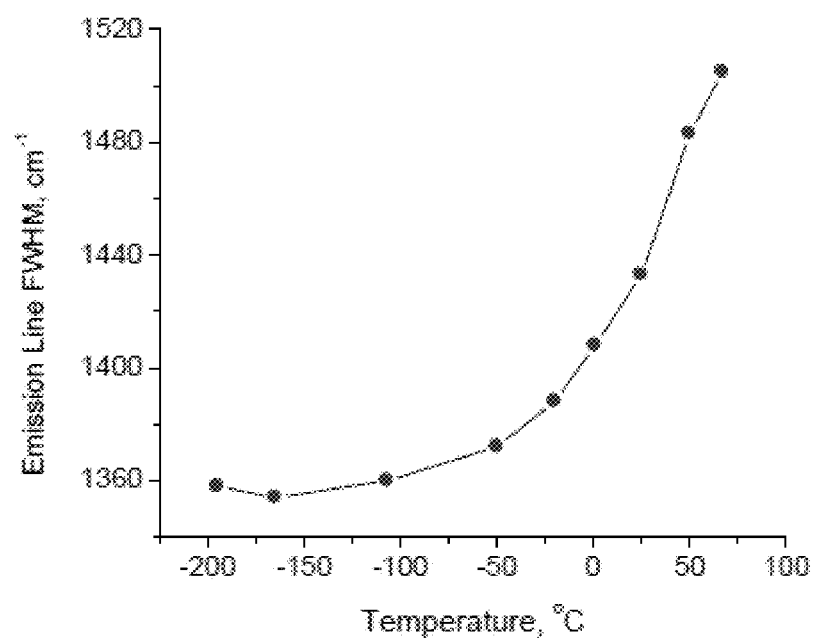
FIG. 51 is a graph showing the temperature dependence of the emission line width for solid sample of dark-green polymeric complex 5.

Line Width (FWHM):

Almost symmetrical signal of the emission from polymeric complex 5 can be best described as two Gaussian-type lines (FIGS. 49, 50). The minor slightly higher energy component contributes from 2.2 to 5.4% intensity into overall fit at +50° C. and −165° C. respectively. During variable temperature studies we also observed line narrowing upon temperature decrease (FIG. 51) which is in agreement with literature data for all mentioned above quazi one-dimensional systems.

It is apparent that tuning the structures of polymeric compound by bringing metal centers closer or providing better conditions for the formation of mixed valence species may result in materials with brighter and diverse range of emission. Given that the 1D aggregate might have relatively large length distribution, it is also important to identify the relationship between the brightness of the emission and the size of the 'poker chip" stack.

Figure 52:
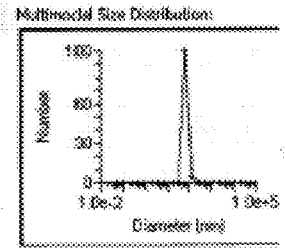
FIG. 52 is a table showing the data of particle size measurements for the complex 5 dispersed in micelles formed in aqueous solutions of Na-decanoate, C$_{10}$H$_{21}$COONa at +23° C.
Figure 53A:
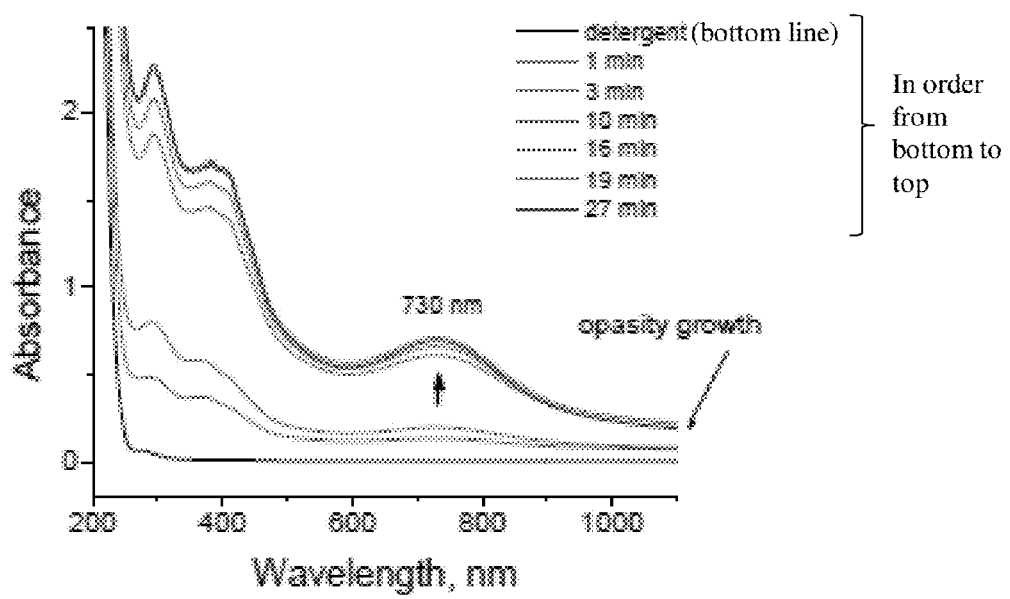
FIG. 53A shows changes in the UV-visible spectra of Na-decanoate (detergent) upon addition of dark-green complex.
Figure 53B:
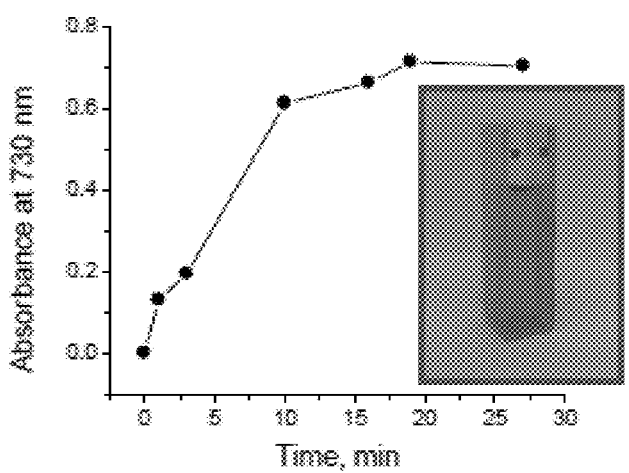
FIG. 53B shows the time provide of micelles stability with an inset showing the actual appearance.
Figures 53C, 53D:
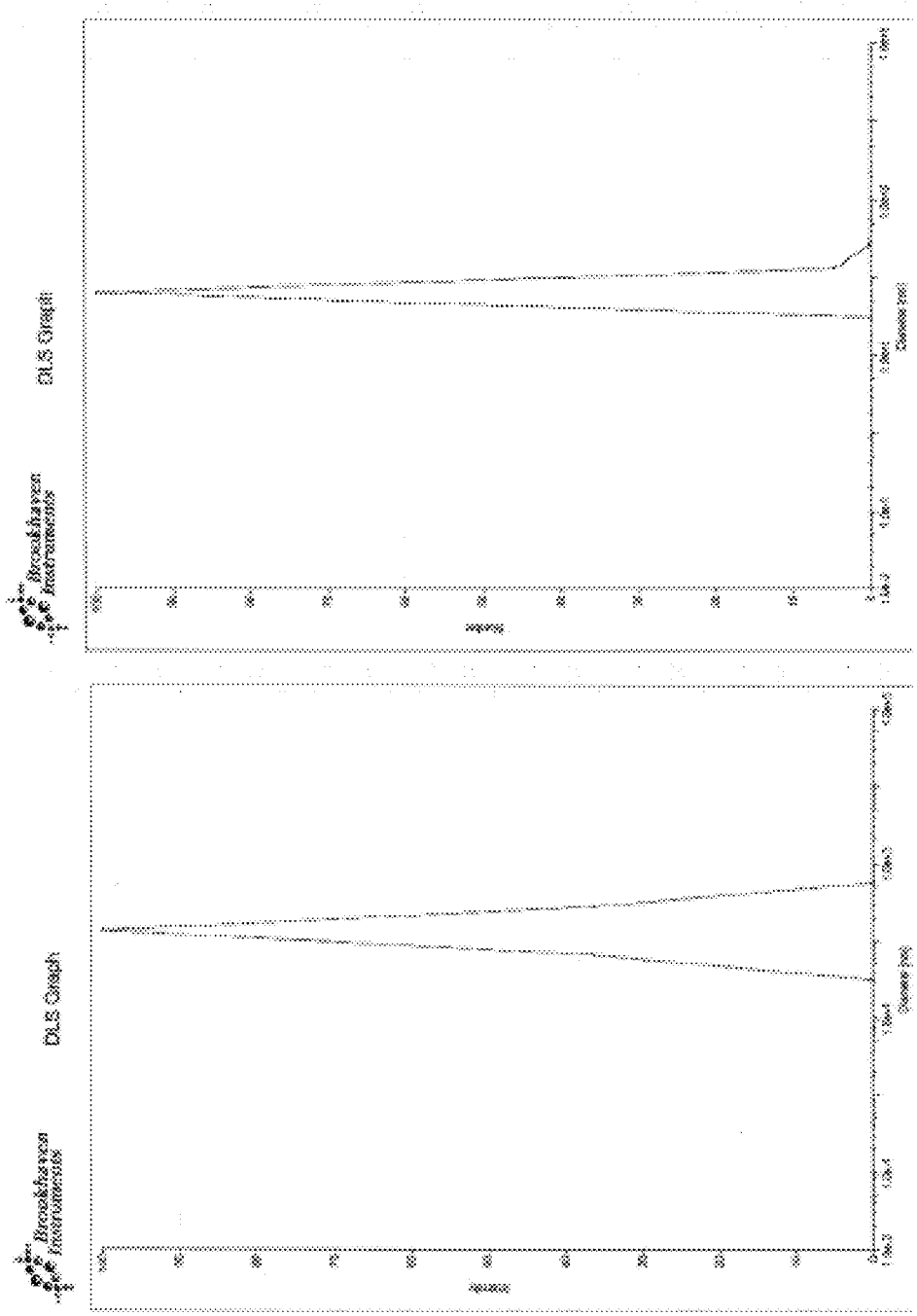
FIG. 53C shows the distribution of particle size by intensity.
FIG. 53D shows the distribution of particle size by the number.

Instead of embedding the complexes in KBr tablets, which are excellent model for the basic research, the complexes may be embedded in more realistic matrices materials. For example, material that are similar to other platinum complexes such as cisplatin and oxaliplatin. Cyanoximates also demonstrate cytotoxicity and in combination with their emissive properties, can be potentially utilized as theranostic agents. For these biomedical imaging and theranostics applications the complexes may be formulated for better bioavailability. Therefore, encapsulation of these NIR emissive complexes may occur in micelles, or water soluble polymeric shell. Preliminary data indicates a facile formation of mono-dispersed micelles based on sodium salts of long-chain carboxylic acids (FIGS. 52, 53).

CONCLUSIONS

In summary, a unique supramolecular assembly based on the platinum (II) complex of $PtL_2$ composition (L=a new cyanoxime ligand; specifically for this description 2-oximino-2-cyano-N,N'-diethyl acetamide, HDECO) is described herein. The complex has three polymorphic forms: monomeric yellow $Pt(DECO)_2$, red dimeric $[Pt(DECO)_2]_2$, and dark-green $[Pt(DECO)_2]_n$. The latter complex represents quasi 1D coordination polymer which strongly absorbs in the 400-900 nm range and luminesces at 1000-1200 nm. This compound also appears to be a solid solution containing non-stoichiometric amounts of Pt(IV) centers. Thus, aggregation of monomeric $Pt(DECO)_2$ units into stacked polymer in aqueous solutions is driven by metallophilic interactions and accompanied with partial oxidation of Pt(II) to Pt(IV). Contrary to other previously reported unstable mixed valence Pd or Pt-based "metal wires", presented in this work dark-green polymeric Pt-cyanoximate is stable in solid state at room temperature for many months. This and similar NIR emissive Pt-cyanoximate complexes with cyanoximes listed in FIG. 1 can be used in light emitting devices and optical sensors to cover wavelengths that are currently unavailable. In addition, due to transparency of the biological tissue at 1060-1150 nm (second optical window) and established cytotoxicity of Pt-cyanoximates, the emissive Pt complexes can be utilized as theranostic agents for anticancer treatment and diagnostics.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention. Further, it will be understood that certain features and subcombinations may be of utility and may be employed within the scope of the disclosure. Further, various steps set forth herein may be carried out in orders that differ from those set forth herein without departing from the scope of the present methods. This description shall not be restricted to the above embodiments.

The invention claimed is:

1. A process for the production of a luminescent polymeric material, comprising reacting $K_2[PtCl_4]$ and a cyanoxime ligand in an aqueous solution to achieve a material having a molecular formula of $PtL_2$, wherein L is the cyanoxime ligand having a molecular formula of 2-cyano-2-oximino-N,N'-diethylacetamide.

2. The process of claim 1, wherein the material luminesces in the near-infrared region of spectrum.

3. The process of claim 1, wherein the $PtL_2$ complex self-assembles in solutions into a luminescent 1D polymeric poker chip structure.

4. The process of claim 1, wherein the $PtL_2$ compound is stable at room temperature.

5. The process of claim 1, wherein the $PtL_2$ complex is incorporated for use in at least one of a light emitting device, an optical sensor, and as a theranostic agent.

6. The process of claim 1, wherein the $PtL_2$ complex has three polymorphic forms comprising monomeric $PtL_2$, dimeric $[PtL_2]_2$, and $[PtL_2]_n$, wherein dimeric $[PtL_2]_2$ is formed by treating $[PtL_2]_n$ with a non-disruptive solvent; and wherein $[PtL_2]_n$ is a dark green precipitate.

7. The process of claim 6, wherein approximately 3-10% by weight $[PtL_2]_n$ is embedded in an inert solid matrix to form a pellet, wherein the inert solid matrix is KBr.

8. The process of claim 6, wherein $[PtL_2]_n$ strongly absorbs in 400-900 nm range and luminesces at 1000-1200 nm.

9. A process for the production of a near-infrared sensitive luminescent polymeric material, comprising reacting $K_2[PtCl_4]$ with a cyanoxime ligand to achieve a formula having the molecular formula $PtL_2$, wherein the cyanoxime ligand is selected from the list consisting of:

(A) 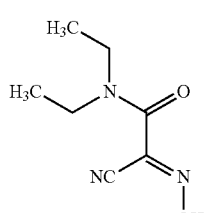
HDECO (B) 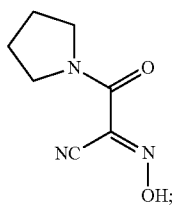
HPyrCO (C) 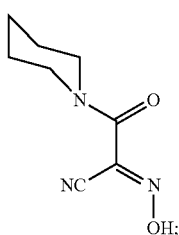
HPiPCO (D) 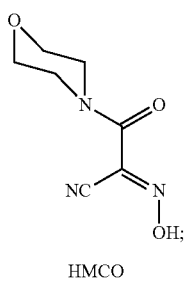
HMCO (E) 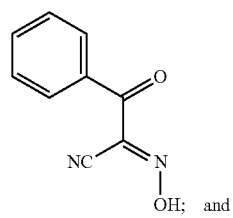
HBCO; and (F) 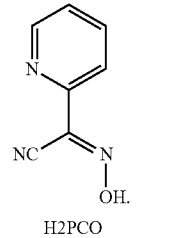
H2PCO 10. The process of claim 9, wherein each of the resulting $PtL_2$ complexes luminesce in the NIR spectrum between 950 nm and 1500 nm.

11. The process of claim 9, wherein the $PtL_2$ complex self-assembles in solutions into a luminescent 1D polymeric poker chip structure.

12. The process of claim 9, wherein approximately 3-10% by weight of the $PtL_2$ complex is embedded with an inert solid matrix to form a pellet.

13. The process of claim 12, wherein the inert solid matrix is KBr.

14. The process of claim 13, wherein the signal intensity of the emission of the KBr pellet with $PtL_2$ decreases with decreasing temperature.

15. The process of claim 13, wherein the emission wavelength of the KBr pellet with $PtL_2$ is higher than the emission wavelength of pure $PtL_2$ powder.

* * * * *